(12) United States Patent
Collin et al.

(10) Patent No.: US 10,365,104 B2
(45) Date of Patent: Jul. 30, 2019

(54) DIGITAL CONTROLLER FOR A MEMS GYROSCOPE

(71) Applicant: MURATA MANUFACTURING CO., LTD., Nagaokakyo-shi, Kyoto (JP)

(72) Inventors: Rauli Collin, Pirkkala (FI); Konsta Wjuga, Helsinki (FI); Lasse Aaltonen, Espoo (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 261 days.

(21) Appl. No.: 15/586,404

(22) Filed: May 4, 2017

(65) Prior Publication Data
US 2017/0328712 A1 Nov. 16, 2017

(30) Foreign Application Priority Data

May 11, 2016 (FI) .................................... 20165402

(51) Int. Cl.
| | |
|---|---|
| *G01C 19/5726* | (2012.01) |
| *H03D 7/00* | (2006.01) |
| *H03G 3/20* | (2006.01) |
| *H03H 17/02* | (2006.01) |
| *H03M 3/00* | (2006.01) |
| *G01C 19/5776* | (2012.01) |

(52) U.S. Cl.
CPC ..... *G01C 19/5726* (2013.01); *G01C 19/5776* (2013.01); *H03D 7/00* (2013.01); *H03G 3/20* (2013.01); *H03H 17/0248* (2013.01); *H03M 3/436* (2013.01); *H03M 3/458* (2013.01); *H03D 2200/005* (2013.01);

(Continued)

(58) Field of Classification Search
CPC .................................................. G01C 19/5726
See application file for complete search history.

(56) References Cited

U.S. PATENT DOCUMENTS 5,487,015 A * 1/1996 White ................ G01C 19/5607
702/117
5,588,027 A * 12/1996 Lim .................... H04L 27/2332
329/304

(Continued)

FOREIGN PATENT DOCUMENTS

| EP | 2 360 448 A1 | 8/2011 |
| EP | 2 466 257 A1 | 6/2012 |
| WO | WO 2015/112780 A1 | 7/2015 |

OTHER PUBLICATIONS

Finnish Search Report dated Jan. 9, 2017 corresponding to Finnish Patent Application No. 20165402.

(Continued)

*Primary Examiner* — Paul M. West
*Assistant Examiner* — Mark A Shabman
(74) *Attorney, Agent, or Firm* — Squire Patton Boggs (US) LLP

(57) ABSTRACT

A digital control circuitry for a MEMS gyroscope is provided. The digital control circuitry comprises a digital primary loop circuitry configured to process a digitized primary signal, a digital secondary loop circuitry configured to process a digitized secondary signal and a digital phase shifting filter circuitry configured to generate two phase shifted demodulation signals from the digitized primary signal. The digital secondary loop is configured to demodulate the digitized secondary signal using the two phase shifted demodulation signals.

17 Claims, 15 Drawing Sheets

(52) U.S. Cl.
CPC ............ *H03D 2200/0054* (2013.01); *H03D 2200/0082* (2013.01); *H03H 2218/04* (2013.01)

(56) References Cited

U.S. PATENT DOCUMENTS

| | | | |
|---|---|---|---|
| 5,757,862 A * | 5/1998 | Ishizu | H04L 27/2331 |
| | | | 329/304 |
| 6,636,826 B1 | 10/2003 | Abe et al. | |
| 7,509,830 B2 | 3/2009 | Mayer-Wegelin et al. | |
| 2004/0088127 A1* | 5/2004 | M'Closkey | G01C 19/56 |
| | | | 702/96 |
| 2006/0238260 A1* | 10/2006 | Demma | G01C 19/56 |
| | | | 331/10 |
| 2007/0180908 A1 | 8/2007 | Seeger et al. | |
| 2010/0212424 A1 | 8/2010 | Malvern et al. | |
| 2013/0268227 A1* | 10/2013 | Opris | G01C 25/00 |
| | | | 702/104 |
| 2015/0143905 A1 | 5/2015 | Kuisma | |

OTHER PUBLICATIONS

J. Raman et al., "A Closed-Loop Digitally Controlled MEMS Gyroscope with Unconstrained Sigma-Delta Force-Feedback," IEEE Sensors Journal, vol. 9, No. 3, Mar. 2009, pp. 297-305.

W. Geiger et al., "Decoupled microgyros and the design principle DAVED," Sensors and Actuators A: Physical, 2002, vol. 95, Nos. 2-3, pp. 239-249.

D. Xia et al., "Design of a Digitalized Microgyroscope System Using ΣΔ Modulation Technology," IEEE Sensors Journal, vol. 15, No. 7, Jul. 2015, pp. 3793-3806.

M. Saukoski et al., "Zero-Rate Output and Quadrature Compensation in Vibratory MEMS Gyroscopes," IEEE Sensors Journal, vol. 7, No. 12, Dec. 2007, pp. 1639-1652.

Ahmad Shaban et al., "Analysis and Design of Gyro-Drive Mode Loop with Amplitude Control," IEEE Design and Test Workshop, 2009, 4 pages.

European Search Report Application No. EP17170316 dated Sep. 28, 2017.

* cited by examiner

DIGITAL CONTROLLER FOR A MEMS GYROSCOPE

BACKGROUND

Field

The present invention relates to micro-electro-mechanical (MEMS) gyroscopes and especially to a digital controller for a micro-electro-mechanical gyroscope. The present invention further relates to a MEMS gyroscope and more particularly to a MEMS gyroscope comprising a digital controller circuitry.

Motion can be considered to have six degrees of freedom: translations in three orthogonal directions and rotations around three orthogonal axes. The latter three may be measured by an angular rate sensor, also known as a gyroscope. MEMS gyroscopes use the Coriolis Effect to measure the angular rate. When a mass is driven in one direction and rotational angular velocity is applied about axis orthogonal to driven axis, the mass experiences a force in orthogonal direction with respect to both driven and rotated axes as a result of the Coriolis force. The Coriolis force is dependent on the speed of movement of the mass. The resulting physical displacement caused by the Coriolis force may then be read from, for example, a capacitive, piezoelectrical or piezoresistive sensing structure.

In MEMS gyroscopes the primary motion is typically not continuous rotation as in conventional ones based on preservation of angular momentum due to lack of adequate bearings. Instead, mechanical oscillation may be used as the primary motion. When an oscillating gyroscope is subjected to an angular motion, an undulating Coriolis force results. This creates a secondary oscillation orthogonal to the primary motion and to the axis of the angular motion, and at the frequency of the primary oscillation. The amplitude of this coupled oscillation can be used as the measure of the angular motion.

A microelectromechanical gyroscope may comprise a body, and at least one inertial element with at least two degrees of freedom within the inertial reference frame. The inertial elements may comprise for example a drive element, also called as a primary element, suspended to the body for vibrational primary motion in a first direction, and a sense element, also called as a secondary element or as a Coriolis element, coupled to the drive element to receive an orthogonal Coriolis force component in a second direction, causing the sense element to move in a vibrational secondary motion. On the other hand, a single inertial element may be used which is configured to have a primary motion in a first direction, a secondary motion in another direction, which inertial element is also configured for a rotational motion in a third direction.

A mass-spring structure typically exhibits a resonance or a resonant behavior by naturally oscillating at some frequencies, called as its resonant frequencies, with greater amplitude than on other frequencies. In these resonant frequencies the displacement is thus much larger than in other frequencies at same excitation magnitude and in the miniaturized dimensions of MEMS structures cause non-linearity and/or over range condition that disturbs the detection.

These disturbances are typically eliminated by damping of the detected motion of a secondary element used for detection. In feed-back damping, or active damping, the detected displacement is monitored and a relative force is generated to oppose the motion. In some known systems, active damping has been implemented with a closed feedback loop. In so called force feedback damping method, filtering and/or other signal processing is included in the feedback loop for adjusting the response function of the feedback loop.

Another challenge in gyroscope design is quadrature error motion. In an ideal gyroscope structure, the primary oscillation and the secondary detection are exactly orthogonal. However, in practical devices imperfections occur, causing direct coupling of the primary motion displacement of the seismic mass to the secondary motion of the gyroscope. This direct coupling is called the quadrature error. The phase difference between the angular motion signal and the quadrature signal is 90 degrees, which means that basically the quadrature error could be eliminated with phase sensitive demodulation. However, the quadrature signal can be very large in comparison with the angular motion signal, and may therefore cause unreasonable requirements for the dynamic range of the readout electronics or phase accuracy of the phase demodulation.

One known method to deal with this error source is electrostatic quadrature cancellation that removes the error signal causing movement of the sensor structure, before the quadrature signal is generated. For this, an electrostatic force, exactly in-phase with the primary oscillation and parallel to the secondary oscillation may be applied to the seismic mass.

Description if the Related Art

U.S. Pat. No. 7,509,830 discloses a method for monitoring a rotation rate sensor having a digital frequency synthesizer and primary and secondary control loops having both digital and analog components. This solution does not have any force feedback for adjusting frequency and gain behaviour of the secondary loop. No compensation of non idealities in the motion is disclosed.

US patent application 2007/0180908 discloses an analog method for compensating quadrature error cancellation signal. A quadrature error cancellation circuit generates a quadrature error cancellation signal, which is used for compensating the quadrature error in the analog secondary signal.

US patent application 2015/0143905 discloses a resonator with force feedback for damping a mechanical resonator having a closed feedback loop. Force feedback enables stabilization of the resonator through changing the response function of the resonator loop.

EP patent application 2360448 discloses a hybrid type primary loop without use of PLL circuits for synchronization. Detection of primary movement is implemented with a discrete time charge amplifier.

PCT publication 2015/112780 discloses an analog drive loop circuitry for a MEMS resonator.

Use of analog signal processing in control loops of a MEMS gyroscope causes several challenges and problems. Analog components are highly sensitive to variations in component parameters, which may cause inaccuracy to detection. For example, variations in manufacturing process, materials and temperature cause significant component parameter variations. Further, it is difficult to create tuneable analog components cost and area effectively. Adding tunability into analog components typically increases area required for the components which again causes increase in risk for leakage currents and parasitic elements. Calibration of a MEMS gyroscope with analog signal processing is a difficult task, and even slight deviation from the optimal calibration cause inaccuracy in detection of the angular rate.

Using analog components for implementing circuitry capable of handling big time constants is difficult, although such may be needed for noise limiting purposes. For example, area required for a suitable analog circuitry may be unpractically large.

Digital solutions for MEMS gyroscope primary loop have been proposed to overcome inaccuracy problems with analog signal processing. A typical digital solution with AC signal detection requires high resolution analog-to-digital conversion, which implies very high clock frequencies for the digital circuitry. High frequencies increase power consumption and also required circuitry area required by the digital circuitry. Thus, a solution is required which enables reducing the clock frequency needed for the digital control circuitry.

Publication "Analysis and Design of Gyro-Drive Mode Loop with Amplitude Control" by Shaban et al, published in IEEE Design and Test Workshop in 2009 discloses a primary mode oscillation loop using an all-digital PLL with a Direct Digital Synthesizer DDS. Although the digital PLL is basically useful solution for introducing the necessary 90 degree phase delay for the primary signal for generating the actuation force, implementing a DDS is a very complicated and area consuming task. A solution is needed which enables generation of the necessary phases shifted signals in the circuitry without a power consuming and highly complex PLL in the digital primary loop.

SUMMARY

An object of the present invention is to provide a method and apparatus so as to overcome the prior art disadvantages. The objects of the present invention are achieved with a digital controller circuitry according to claim 1.

The preferred embodiments of the invention are disclosed in the dependent claims.

In one aspect, the present invention is based on the idea of introducing a fully digital control circuitry for a MEMS gyroscope, which is configured to control movement of the inertial masses, compensate unideal movements of the MEMS gyroscope and detect angular velocity.

According to a first aspect, a digital control circuitry for a MEMS gyroscope is provided. The digital control circuitry comprises a digital primary loop circuitry configured to process a digitized primary signal. The digital primary loop circuitry comprises a first analog-to-digital converter configured to digitize an analog primary input signal into the digitized primary signal, and a first infinite impulse filter configured to cause a −90-degree phase shift of the digitized primary signal on a resonance frequency of a mechanical resonator of the MEMS gyroscope, the first digital infinite impulse response filter providing in its output a filtered digitized primary signal. The digital control circuitry comprises a digital secondary loop circuitry configured to process a digitized secondary signal and a digital phase shifting filter circuitry configured to generate two phase shifted demodulation signals from the filtered digitized primary signal. The digital secondary loop is configured to demodulate the digitized secondary signal using the two phase shifted demodulation signals.

According to a second aspect, the first infinite impulse response filter is further configured to filter quantization noise in the digitized primary signal caused by the first analog-to-digital converter.

According to a third aspect, the digital secondary loop circuitry comprises a second analog-to-digital converter configured to digitize an analog secondary input signal into the digitized secondary signal. The digital phase shifting filter circuitry produces at its outputs the two phase shifted demodulation signals comprising an in-phase demodulation signal and a quadrature demodulation signal. The digital secondary loop circuitry further comprises a coherent detector circuitry configured for receiving the in-phase demodulation signal and the quadrature demodulation signal and for performing a phase aligned demodulation of the digitized secondary signal using the in-phase and quadrature demodulation signals.

According to another aspect, the analog primary signal and the analog secondary signal comprise continuous time signals.

According to a fourth aspect, the digital secondary loop further comprises a second digital low pass IIR filter configured to cause a −90 degree phase shift of the digitized secondary signal on the resonance frequency of the mechanical resonator of the MEMS gyroscope.

According to a fifth aspect, the second digital low pass filter is further configured to filter quantization noise in the digitized secondary signal caused by the second analog-to-digital converter.

According to a further aspect, the first and second digital low pass filters comprise digital low pass filters of second or higher order.

According to a yet further aspect, the second digital low pass filter comprises second order digital low pass filter and has a quality value in range from 1 to 20.

According to another aspect, the first digital low pass filter comprises second order digital low pass filter and has a quality value in range from 1 to 4.

According to a sixth aspect, the digital phase shifting filter circuitry comprises at least two digital filters configured for phase shifting the digitized primary signal for generating the in-phase demodulation signal and the quadrature demodulation signals, and wherein the phase shifting digital filters are configured to be calibrated with calibrated filter coefficients, which coefficients may vary based on temperature.

According to another aspect, any of the first and second analog-to-digital converters comprise a sigma-delta analog-to-digital converter.

According to a further aspect, the sigma-delta converter comprises a continuous-time sigma-delta analog-to-digital converter.

According to yet further aspect, a quantization noise transfer function of the analog-to-digital converter is configured have a notch at the resonance frequency of the mechanical resonator of the MEMS gyroscope.

According to another aspect, the digital primary loop further comprises an automatic gain control circuitry configured to detect a total alternating amplitude level of the digitized primary signal and to control a digital multiplication element configured to multiply the amplitude of the digitized phase shifted primary signal for producing a digital primary AC signal.

According to a yet another aspect, the digital primary loop further comprises an automatic gain control circuitry configured to detect a total alternating amplitude level of the digitized primary signal and to provide a DC signal to be summed with the phase shifted digitized primary signal for producing the digital primary AC signal.

According to a further aspect, the digital primary loop further comprises a start-up circuitry configured to provide a start-up signal in the digital primary loop, the start-up signal comprising a digital pulse form causing the first digital infinite impulse response filter to output a signal comprising a frequency component at the resonance frequency of the mechanical resonator of the MEMS gyroscope.

According to a further aspect, the digital primary loop further comprises an amplitude limiting circuitry configured to control amplitude of the filtered digitized primary signal at the output of the first digital infinite impulse response filter.

According to a yet further aspect, the coherent detector circuitry comprises an in-phase branch comprising a first mixer circuitry configured to use the in-phase demodulation signal for down converting the digitized secondary signal into an in-phase magnitude signal, and a quadrature branch comprising a second mixer circuitry configured to use the quadrature demodulation signal for down converting the digitized secondary signal in to a quadrature magnitude signal. The in-phase branch of the coherent detector circuitry further comprises a vector norm circuitry configured to calculate a vector norm for the in-phase magnitude signal, the vector norm comprising absolute value of length of in-phase magnitude value and quadrature magnitude value vectors combined.

According to a further aspect, at least one of the in-phase branch and the quadrature branch further comprise a decimating filter configured to filter and to reduce the sampling rate of the respective magnitude signal.

According to another aspect, the digital controller circuitry is further configured to provide the filtered digitized primary signal as an input to a phase locked loop circuitry, wherein the phase locked loop circuitry is configured to provide a master clock for the digital controller, and wherein the master clock is synchronized to the resonance frequency of the mechanical resonator of the MEMS gyroscope.

According to a further aspect, a MEMS gyroscope is provided comprising a digital controller circuitry according any of the above aspects. The MEMS gyroscope comprises a primary element, a secondary element, analog front end circuitry configured to process analog electrical signals received from the primary and secondary elements, and a digital controller circuitry. The primary element and the secondary element are configured to be provided with a DC rotor bias voltage for capacitive detection of motion of the elements.

According to a yet further aspect, the DC rotor bias voltage is up to 20 times higher than a highest AC drive signal amplitude.

Embodiments of the invention provide advantage of enabling precise detection of angular velocity, good detection and compensation capability of non-idealities, low sensitivity to variation of component parameters and good noise tolerance. Need to use a PLL for generating a precise reference clock may be omitted, since the digital primary loop circuitry provides a source of a reliable oscillating signal, which is in set frequency and phase relation with the signal of the primary oscillation. Omitting the PLL reduces silicon area required by the circuitry. The digitized primary signal and derivatives thereof may be used for signal processing in the secondary loop circuitry. Use of digital filters enables generation of precise phase shift for the signals while also performing required filtering.

Some embodiments also disclose combination of features in a digital control circuitry, which enable saving of power even if benefits of a digital circuitry are provided for accuracy and flexibility. Area of the digital circuitry is small when compared either with analog circuitry having respective functionality or even with existing digital solutions, which not only contributes to power saving, but also reduces cost of the circuitry. Disclosed embodiments enable use of a low clock frequency in the digital parts without compromising the accuracy of the MEMS device. Low clock frequency in the digital circuitry facilitates low energy consumption.

A single digital filter in the primary loop provides several functionalities improving performance of the entire circuitry in a very cost efficient way, with relatively small amount of processing. One single digital filter may provide filtering for ADC quantization noise, phase shifting necessary for driving the primary resonator, generation of a start-up stimulus towards the primary resonator, and provision of a filtered demodulation signal towards the secondary loop. Even further, the same digital filter in the primary loop may provide a filtered oscillating signal towards a PLL for generation of a stable system clock in the PLL. The same digital filter may even be used for compensating changes in the resonance frequency due to temperature.

Likewise, a single digital low pass infinite impulse response (IIR) filter beneficially provides several functionalities in the secondary loop improving performance of the circuitry in a very cost efficient way, with relatively small amount of processing and circuit area. The single digital low pass IIR filter in the secondary loop is configured to cause a −90-degree phase shift to the digitized secondary signal at a resonance frequency of a mechanical resonator of the MEMS gyroscope. The provided phase shifted digitized secondary signal is used as the input signal towards the coherent detection for detection of angular rate and for quadrature compensation purposes. Further, the same phase shifted secondary signal is ready to be used as input for the force feedback functionality.

It is to be understood that any of the above modifications can be applied separately or in combination to the respective aspects to which they refer, unless they are explicitly stated as excluding alternatives.

BRIEF DESCRIPTION OF THE DRAWINGS

In the following the invention will be described in greater detail, in connection with preferred embodiments, with reference to the attached drawings, in which.

DETAILED DESCRIPTION OF CERTAIN EMBODIMENTS

Figure 1:
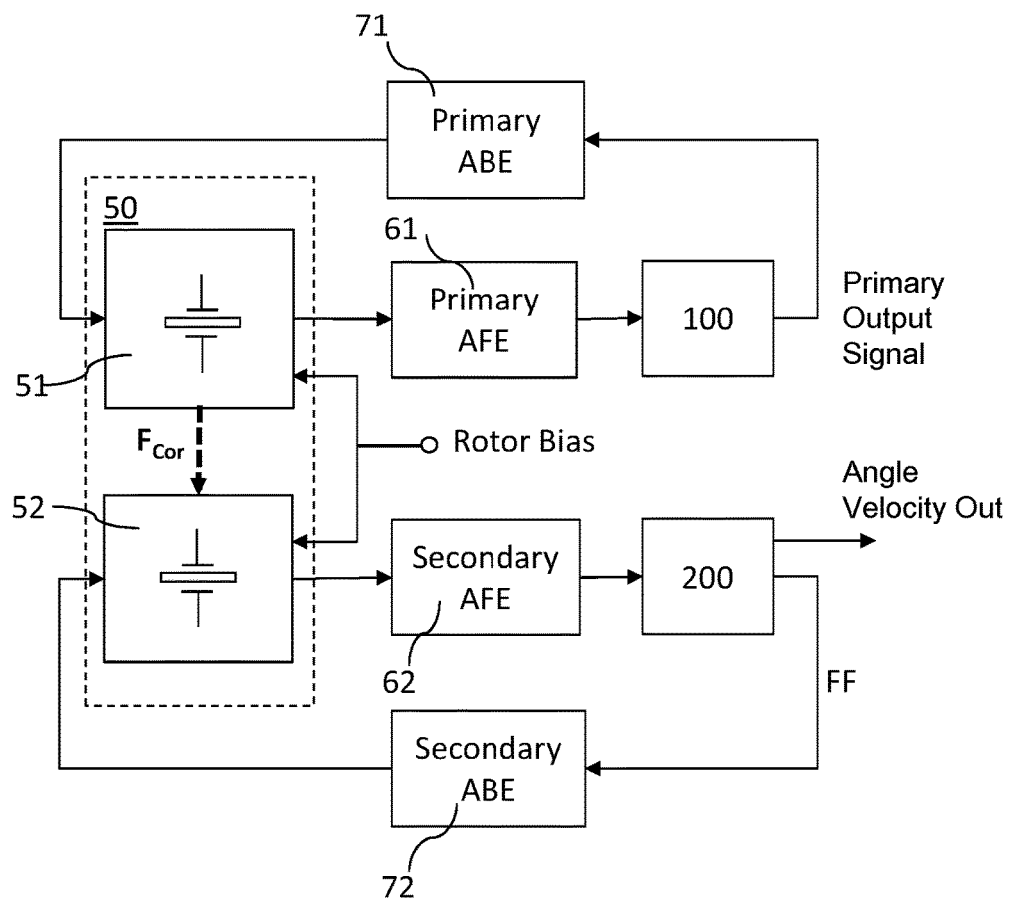
FIG. 1 illustrates a high-level schematic of digital gyroscope.

Herein below, certain embodiments of the present invention are described in detail with reference to the accompanying drawings, wherein the features of the embodiments can be freely combined with each other unless otherwise described. Description of certain embodiments is given for by way of example only, and it is by no way intended to be understood as limiting the invention to the disclosed details.

Moreover, it is to be understood that the apparatus is configured to perform the corresponding method, although in some cases only the apparatus or only the method are described.

As used in this application, term "circuitry" refers to all of the following: (a) hardware-only circuit implementations and (b) combinations of circuits and software (and/or firmware), such as (i) to a combination of processor(s) or (ii) to portions of processor(s)/software (including digital signal processor(s), software and memory(ies) that work together to cause an apparatus to perform various functions and (c) to circuits, such as microprocessor(s) or a portion of a microprocessor(s) that require software or firmware for operation, even if the software or firmware is not physically present. Hardware of a circuit implementation may include any and all of application specific circuit(s) (ASIC) or general configurable circuitry such as field programmable gate array(s) (FPGA), or like.

Term "primary mass" refers to a drive mass of a MEMS gyroscope that is driven to a primary oscillating motion with an electrical drive signal, which may also be called as the primary drive signal. Primary mass may sometimes be called in literature as the driving mass. A primary mass may comprise one of more parts. Term "primary element" refers to the entire primary mechanical element including the primary mass acting as a moving rotor and at least electrodes used for driving the primary mass. In a capacitive gyroscope, the electrodes comprise one or more stators acting as fixed electrodes, whereas the primary mass is a moving electrode.

Term "secondary mass" refers to a sense or detection mass of a MEMS gyroscope, coupled to the drive element (primary mass) to receive an orthogonal Coriolis force component causing the secondary mass to move in a vibrational secondary motion. Secondary mass may sometimes be called as a sensing mass, a sense mass, a detection mass or a Coriolis mass. A secondary mass may comprise one or more parts. Term "secondary element" refers to the entire secondary, or sensing mechanical element including the secondary mass and at least electrodes used for detecting motion of the secondary mass. In a capacitive gyroscope, the electrodes comprise one or more stators acting as fixed electrodes, whereas the secondary mass is a moving electrode.

In some embodiments, the primary and secondary masses may comprise a single combined mass, which is capable of moving in primary and secondary motions.

Term "primary signal" refers to an electrical signal detected by electrodes of a primary element of a gyroscope, caused by the movement of the primary mass. The primary signal may be obtained for example capacitively, piezoelectrically or piezoresistively with applicable electrodes.

Term "digitized primary signal" refers to the digital signal in the digital primary loop generated by digitizing the primary signal. The digitized primary signal may be in its original phase or it may be phase shifted.

Term "filtered digitized primary signal" refers specifically to the digitized primary signal in the digital loop after phase shifting and filtering it by the primary loop digital filter.

Term "secondary signal" refers to an electrical signal detected by electrodes of a secondary element of a gyroscope, caused by the movement of the secondary mass. The secondary signal may be obtained for example capacitively, piezoelectrically or piezoresistively with applicable electrodes.

Term "digitized secondary signal" refers to the digital signal in the secondary loop generated by digitizing the secondary signal. The digitized secondary signal may be in its original phase or after it may be phase shifted.

Terms "primary loop", "drive loop" and "primary drive loop" refer to circuitry configured for processing the primary signal obtained from electrical detection of movement of the primary mass and/or driving the primary mass into an oscillating primary motion. Term "secondary loop" and "secondary sense loop" refer to circuitry configured for processing the secondary signal.

Term "quadrature movement" refers to movement of the secondary mass caused by direct coupling of the primary motion displacement of the primary mass to the secondary motion of the secondary mass of the gyroscope. "Quadrature error" refers to the unwanted signal component(s) caused by the quadrature movement in the detection signal obtained from the secondary mass.

Mechanical resonance frequencies of the primary element and the secondary element may be designed to be approximately the same, so that a common term resonance frequency $f_{RES}$ can be used for referring a single frequency common to both masses.

FIG. 1 illustrates a high-level schematic of a MEMS gyroscope. An electro-mechanical MEMS resonator (50) may be characterized by the two main motions: primary and secondary motion. The MEMS resonator (50) may comprise a single moving MEMS mass in a single MEMS element capable for both primary and secondary motions, or it may comprise two or more MEMS elements and moving masses. For simplicity, FIG. 1 illustrates a resonator with two MEMS elements, a primary element (51) and a secondary element (52), the latter of which may also be called as a detection element or a sensing element. At least one primary mass of the primary element (51) is driven into a stable primary oscillation with a closed primary drive loop, which includes analog front end circuitry (61), a digital primary loop circuitry (100) and analog primary back end circuitry (71). Movement of the primary mass(es) is coupled to at least one secondary mass of the secondary element (52). A Coriolis force $F_{Cor}$ due to angular velocity effecting the secondary mass(es) causes secondary, detection movement of at least one secondary mass of the secondary element. The movement of the secondary mass(es) of the secondary element is detected by the detection circuitry, which includes analog secondary analog front end circuitry (62), a digital secondary loop circuitry (200) and optionally a secondary analog back end circuitry (63). The detection circuitry produces an electrical signal (Angular velocity Out) indicating amount of angular velocity detected by the sensor device about defined detection axis. The detection circuitry may include a force feedback loop, in which case the secondary analog back end circuitry (72) is utilized for feeding the force feedback (FF) signal from the digital secondary loop circuitry (200).

In a MEMS gyroscope according to the embodiments of the invention, the primary and secondary elements are preferably biased with a common DC bias voltage called a rotor bias. A DC bias indicates, that there is a steady DC bias voltage over all signal capacitances of rotor- and stator pairs in the primary and secondary elements of the MEMS gyroscope. For example, a DC bias voltage between 5 Volts and 20 Volts may be applied. One exemplary way to bias the primary and secondary elements is to couple the same bias voltage to all rotors (primary and secondary masses) with the same bias voltage, which causes the rotors to have a DC voltage which is either higher or lower than the DC voltage level of all the respective stators. However, several alternatives exist for DC biasing, and DC biasing of primary and secondary elements may even use different bias voltages.

It is beneficial for driving (excitation) functionality that a high DC bias voltage provides a strong electrostatic force for driving the primary element.

For detection (sensing) functionality, a DC bias voltage over a varying capacitance between a rotor and a stator electrodes causes a signal current to be generated in the rotor and stator electrodes whenever, and only due to capacitance changes. No signal current is generated if capacitance remains unchanged. This changing current may be detected with the analog front end (AFE) circuitry. A vibratory MEMS gyroscope operates at a resonance frequency $f_{RES}$, so that even when the MEMS gyroscope is subject to a constant rotation rate, it provides a changing current through the electrodes. Detection of motion of both the primary and secondary elements can be implemented with the DC bias. Especially with capacitive elements, a strong detection signal is received as a result of high DC bias value.

A relatively high DC bias voltage is more practical to generate and manage than a high AC bias. A high DC bias voltage increases not only electrostatic forces affecting the primary and secondary elements, but also the received signal currents. Use of a DC bias voltage is beneficial over an AC bias, since DC bias requires much lower currents than an equally high AC bias voltage. If a high AC bias was fed towards the primary element with high current level, all static capacitance loads need to be fed constantly with the AC bias current. Constant feeding of capacitive loads can be avoided by choosing a DC bias.

Figure 2:
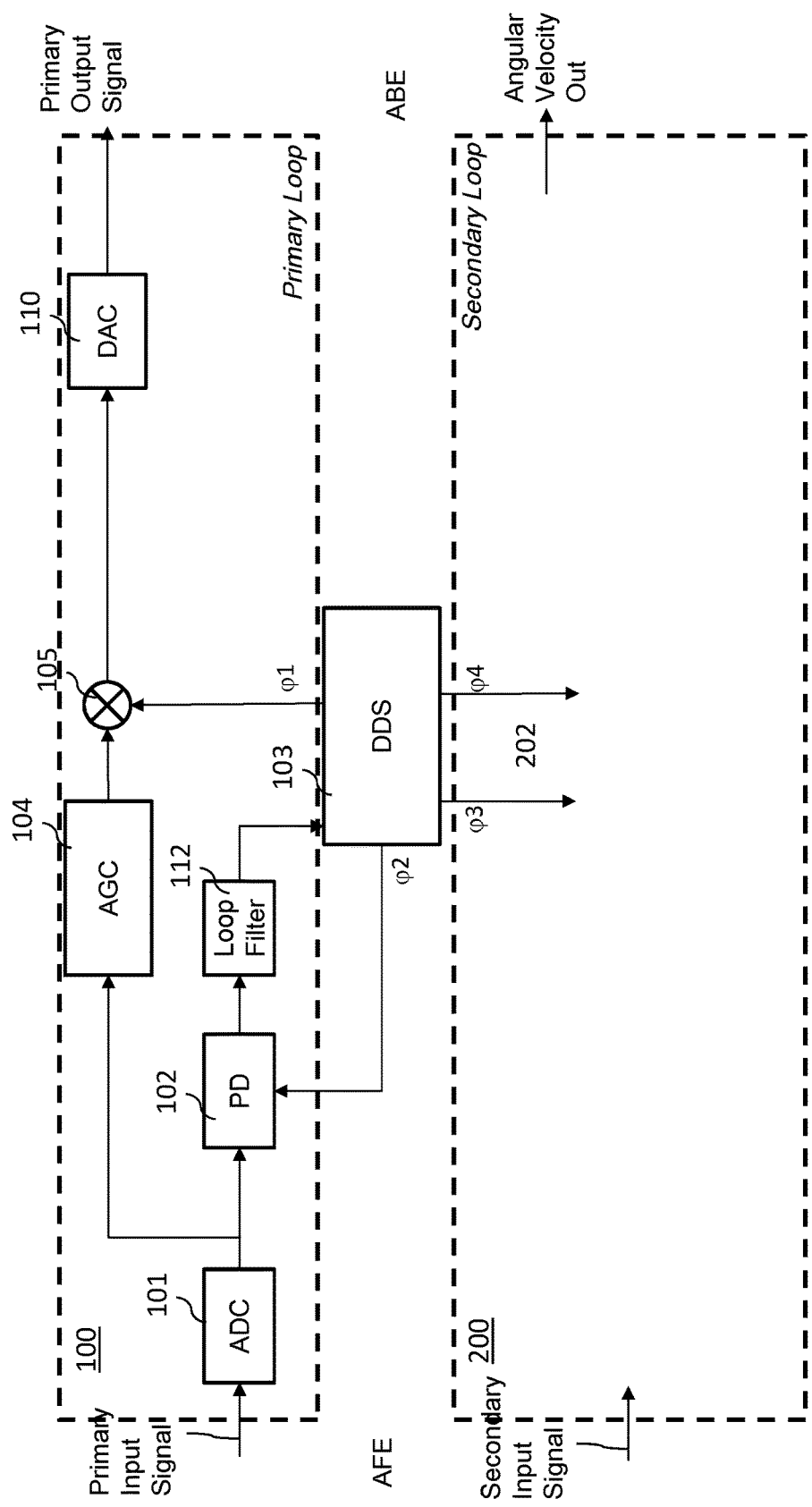
FIG. 2 shows an exemplary schematic of a digital primary loop circuitry for a MEMS gyroscope.

FIG. 2 illustrates an exemplary digital circuitry for a MEMS gyroscope digital primary loop circuitry (100). In the digital primary loop circuitry (100), an all-digital phase locked loop is arranged using a direct digital synthesizer DDS (103). Use of a DDS (103) in the primary loop is known from prior art as disclosed above.

Primary signal received from the primary analog front end circuitry is digitized with an analog-to-digital converter (101). The digitized primary input signal is fed into a digital phase detector PD circuitry (102), which compares the phase of the incoming digitized primary input signal with phase of a signal received from a direct digital synthesizer circuitry DDS (103), also known as a numerically controlled oscillator (NCO). The phase detector PD (102) provides a control signal to the direct digital synthesizer circuitry DDS (103) through a loop filter (112). The loop filter (112) defines dynamics of a digital phase locked loop (PLL), which is formed by the phase detector PD (102), the loop filter (112) and the direct digital synthesizer DDS (103). As known by a person skilled with the art, the loop filter (112) allows to design the natural frequency i.e. bandwidth and damping ratio of the PLL. A narrow bandwidth reduces noise in the PLL, but increases PLL settling time and vice versa. The loop filter (112) further reduces distortion and/or noise, which would easily cause error in phase and amplitude detection.

The frequency and phase of the oscillation of the DDS circuitry (103) shall be set to a value which causes the phase difference between the oscillating primary output signal in the analog back end initially produced in the digital domain by the DDS circuitry (103) and the phase of the primary signal corresponding to the oscillating motion of the primary mass is essentially equal to 90 degrees. Delays caused by digital signal processing, particularly by the first analog-to-digital converter ADC (101) and the first digital-to-analog converter DAC (110) vary between different circuitry implementations, and these delays are taken into account in calculation of the actual phase difference between the digitized primary input signal received at the input of the phase detector PD (102) and the needed digital oscillation signal φ1 provided at the output of the DDS circuitry (103). For example, data stream may be provided towards the first digital-to-analog converter DAC (110) in serial or in parallel form, which cause different amounts of delay. The phase detector circuitry PD (102) further detects amplitude value of the digitized primary signal received from the analog-to-digital converter ADC (101), which amplitude value is representing the amplitude of the analog primary input signal received from the primary part of the analog front end (AFE).

The amplitude of the first digital oscillation signal (φ1) may be such that the wanted amplitude of the primary output signal may be generated by suitably multiplying the first digital oscillation signal (φ1). In such case, the digital multiplication element (105) may be used, which multiplies the amplitude of the received first digital oscillation signal (φ1) in order to produce the wanted analog oscillation signal amplitude for the primary output signal by converting the multiplied signal with a first digital-to-analog converter DAC (110). Automatic Gain control circuitry AGC (104) controls the multiplication. The analog back end (ABE) circuitry may further process this primary output signal before feeding it as a primary drive signal to the electrodes used for driving the primary mass as known by a person skilled in the art. The primary output signal causes the analog back end (ABE) circuitry to cause a force driving the primary mass into an oscillating primary motion.

The direct digital synthesizer DDS (103) produces at least one digital oscillation signal (φ1) suitably synchronized with the digitized input signal, which is generated based on the primary input signal. Thus, the primary input signal is indirectly used for generating all needed digital oscillation signals (φ1, φ2, φ3, φ4) for the digital primary and the digital secondary loop circuitries with set frequency and set relative phases.

In FIG. 2, a DDS circuitry (103) is illustrated which provides a total of four different digital oscillation signals (φ1, φ2, φ3, φ4). Each of these digital oscillation signals have the same frequency $f_{DDS}$, which is approximately equal to the resonance frequency of the mechanical resonator $f_{RES}$ of the primary mass, and thus also approximately equal to the frequency of the primary input signal. Relative phases of these four digital oscillation signals (φ1, φ2, φ3, φ4) to the primary input signal are set to fit the intended use of each specific digital oscillation signal, taking into account any delays in the relevant signal chains. This relative phase setting may be implemented in several different ways. The first digital oscillation signal ($\varphi 1$) has preferably a steady first phase difference $\varphi_1$ to the phase of the primary signal, so that the first digital oscillation signal has a form $f_{\varphi 1}$=cos $(2\pi f_{PRIM}T+\varphi_1)$. This first phase difference $\varphi_1$ should be set taking into account all delays in the analog and digital signal chains between the primary mass and the DDS (103) so that the drive signal generated in the analog back end (ABE) based on the primary output signal provided by the digital primary loop (100) and the primary signal detected from the primary element have a 90 degree phase difference similarly to the solutions using an LPF for phase shifting. Phases of the other three digital oscillation signals ($\varphi 2$, $\varphi 3$, $\varphi 4$) are digitally calibrated, and have form of $f_{\varphi N}$=cos($2\pi f_{PRIM}T+\varphi_N$) or $f_{\varphi N}$=sin($2\pi f_{PRIM}T+\varphi_N$).

The DDS (103) may alternatively be configured for providing just a single digital output oscillation signal synchronized with the reference signal (the digitized primary signal). The frequency of the output oscillation signal $f_{DDS}$ may be equal to the primary signal $f_{DDS}$=$f_{RES}$. Additional digital circuitry (not shown) may be used for generating the needed digital oscillation signals ($\varphi 1$, $\varphi 2$, $\varphi 3$, $\varphi 4$) for the digital primary and the digital secondary loops based on a single digital oscillation signal provided by the direct digital synthesizer DDS (103). Such additional circuitry may comprise multiple of all-pass filters each producing one of the wanted phase delays to the output oscillation signal $f_{DDS}$. If the frequency of the output oscillation signal is higher than the primary signal frequency ($f_{DDS}$>$f_{RES}$), a frequency multiplication causes the provided digital oscillation signal to have a lower frequency than the output signal of the DDS (103). The additional circuitry may further be configured to adjust phases of the provided oscillation signals so that the produced digital oscillation signals ($\varphi 1$, $\varphi 2$, $\varphi 3$, $\varphi 4$) eventually have equal frequency and the intended phase differences in relation to the primary signal.

As known by a person familiar with the art, a DDS implementation enables very low noise signal generation. For example, it is desirable to produce low noise demodulation signals for use in the secondary loop. However, amount of circuitry required for such implementation is rather large, and the larger the amount of circuitry, the larger is also power consumption. Further, start-up of a MEMS resonator with a DDS based PLL in its primary loop is quite complicated, since frequency of the DDS shall be precisely adjusted to match the resonance frequency $f_{RES}$ and careful calibration is required for the DDS based PLL before start-up is successful and reliable. In a circuitry with a DDS based PLL, an exact frequency match is necessary for example for ensuring a reliable start-up for the device.

Figure 3:
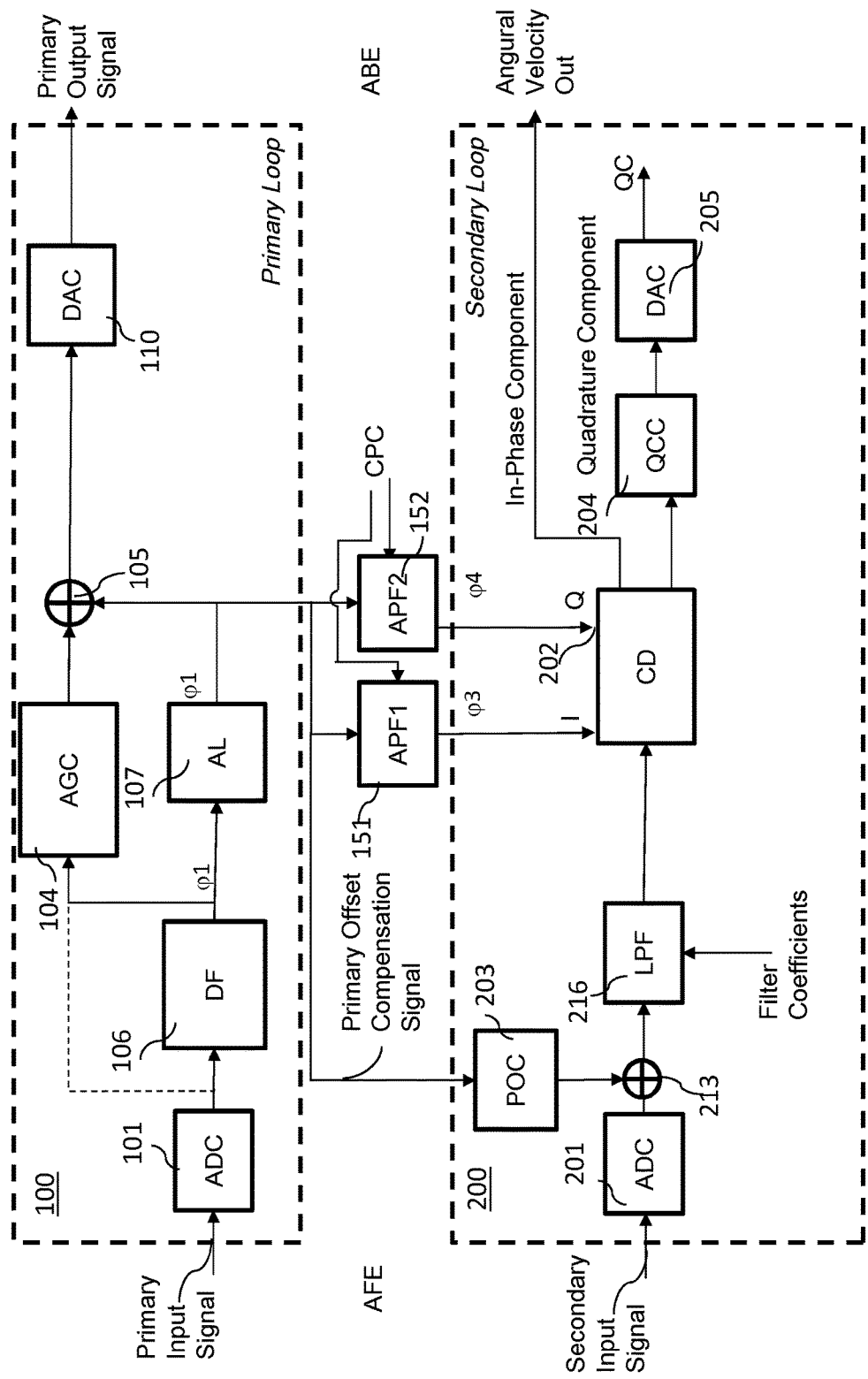
FIG. 3 shows a first exemplary schematic of a digital controller circuitry for a MEMS gyroscope.

FIG. 3 discloses a first exemplary embodiment of the digital control circuitry.

The digital controller circuitry comprises a digital primary loop circuitry (100), which may also be called as the digital primary loop, and a digital secondary loop circuitry (200), which may be called as the digital secondary loop. As explained in connection to FIG. 1, movements of mechanical resonators comprising at least a primary mass and a secondary mass are detected with detection electrodes. Analog detection signals are received by in the analog front end (AFE) circuitry from the primary and secondary detection electrodes. These analog detection signals may be called as the primary signal and the secondary signal. The primary signal is preferably processed by the circuitry of the analog front end circuitry to produce the primary input signal. The secondary signal is preferably processed by the circuitry of the analog front end circuitry to produce the secondary input signal. The analog front end (AFE) may further be logically divided into a primary analog front end and secondary front end based on whether the circuitry is configured to process primary or secondary signal.

If capacitive detection is used, the analog front end includes charge to voltage converters for converting detected charge in each of the capacitive electrodes into a voltage signal. The analog front end (AFE) may comprise circuitry for filtering, such as anti-alias filtering. The analog front end (AFE) may further comprise circuitry for amplifying the analog signal, and a circuitry for driving an analog-to-digital converter, for example a buffer amplifier circuitry and an anti-alias filter. The purpose of the analog front end is to provide the primary (100) and secondary (200) loops with analog primary and secondary input signals suitable for analog-to-digital conversion and subsequent digital signal processing within the fully digital primary (100) and secondary (200) loops.

Analog, continuous time detection of the primary and/or secondary mass may be used with a high DC detection bias voltage fed to the rotor electrodes of the primary and secondary masses, so that high level of signal current is generated for the primary and secondary signals. With continuous time detection, the primary input signal and the secondary input signal comprise continuous time signals.

Use of high DC bias voltage for the rotor electrodes enables low clock frequency to be used in the digital parts. Digital clock frequency may be lowered thanks to the fact that demodulation required for AC detection signal is not needed when DC detection is applied. The use of DC bias voltage for detection and actuation electrodes enables also low complexity electrostatic control of resonance frequency. Frequency tuning capability using DC detection and actuation is in part helping to reduce power consumption, costs, and increasing performance as secondary and primary resonances can be tuned to match.

The digital primary loop circuitry (100) produces the primary output signal for the analog back end (ABE) circuitry. Analog back end (ABE) circuitry may comprise circuitry, such as one or more filters, for reducing quantization noise from the first digital-to-analog converter DAC (110) of the primary loop, and analog buffers. The analog back end (ABE) circuitry is configured for driving the primary mass into the intended primary motion. For example, the analog back end may comprise continuous time amplifiers. The primary element, the primary analog front end, the digital primary loop circuitry (100) and the primary analog back end form a closed drive loop configured to drive the primary mass into a stable oscillating motion.

The digital secondary loop (200) produces a detection result output signal indicating the angular velocity measured with the MEMS device. Further, the digital secondary loop (200) may produce a quadrature compensation signal (QC), which may be used for compensating quadrature error electrostatically. As known by a person skilled with the art, electrostatic compensation of quadrature error is common with sensor elements configured for capacitive sense and drive. If quadrature compensation is used, a quadrature compensation signal (QC) is generated in the secondary loop to be used in the analog back end (ABE) for compensating quadrature error in motion of the secondary mass.

Figure 4:
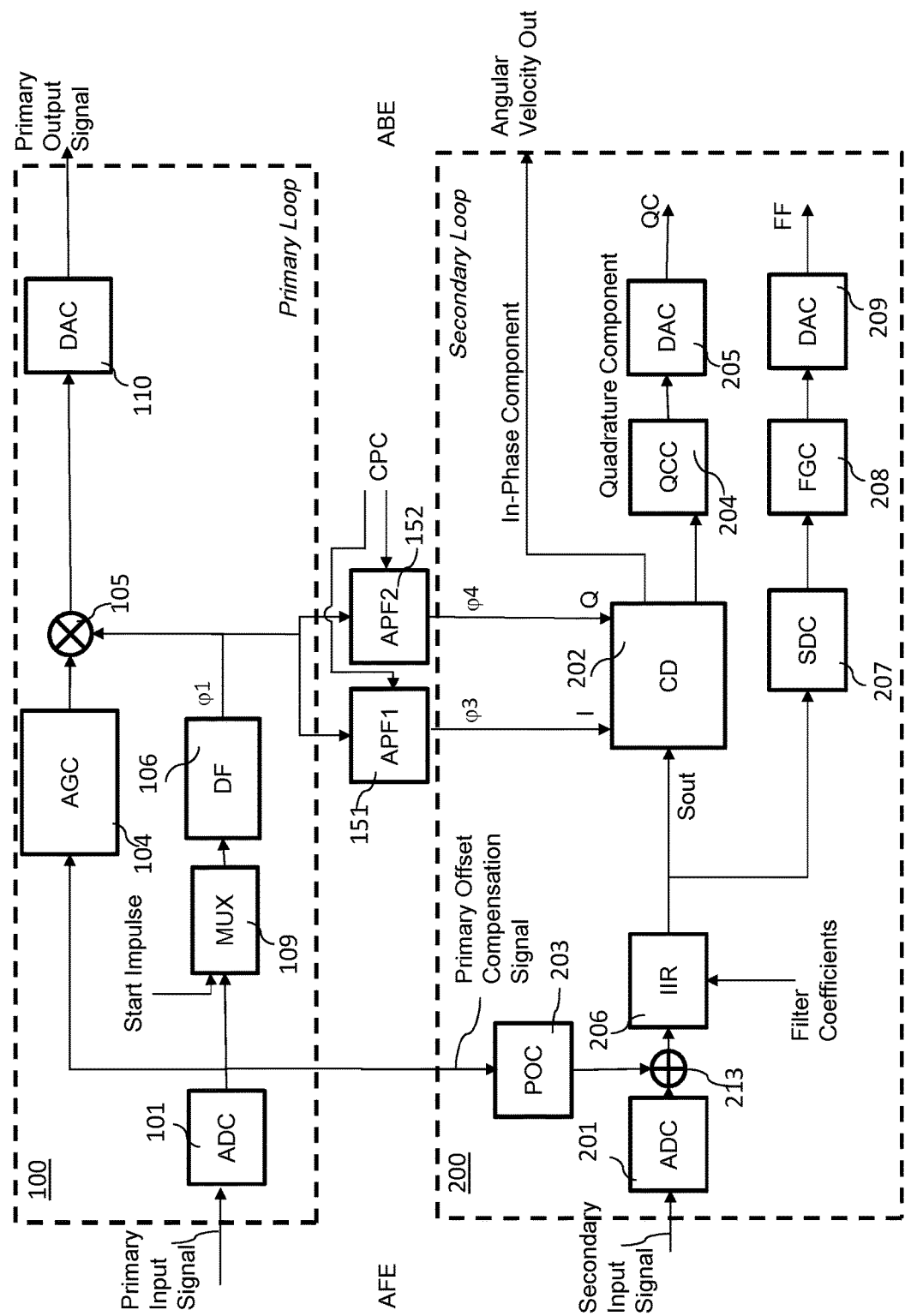
FIG. 4 shows a second exemplary schematic of a digital controller circuitry for a MEMS gyroscope.
Figure 5:
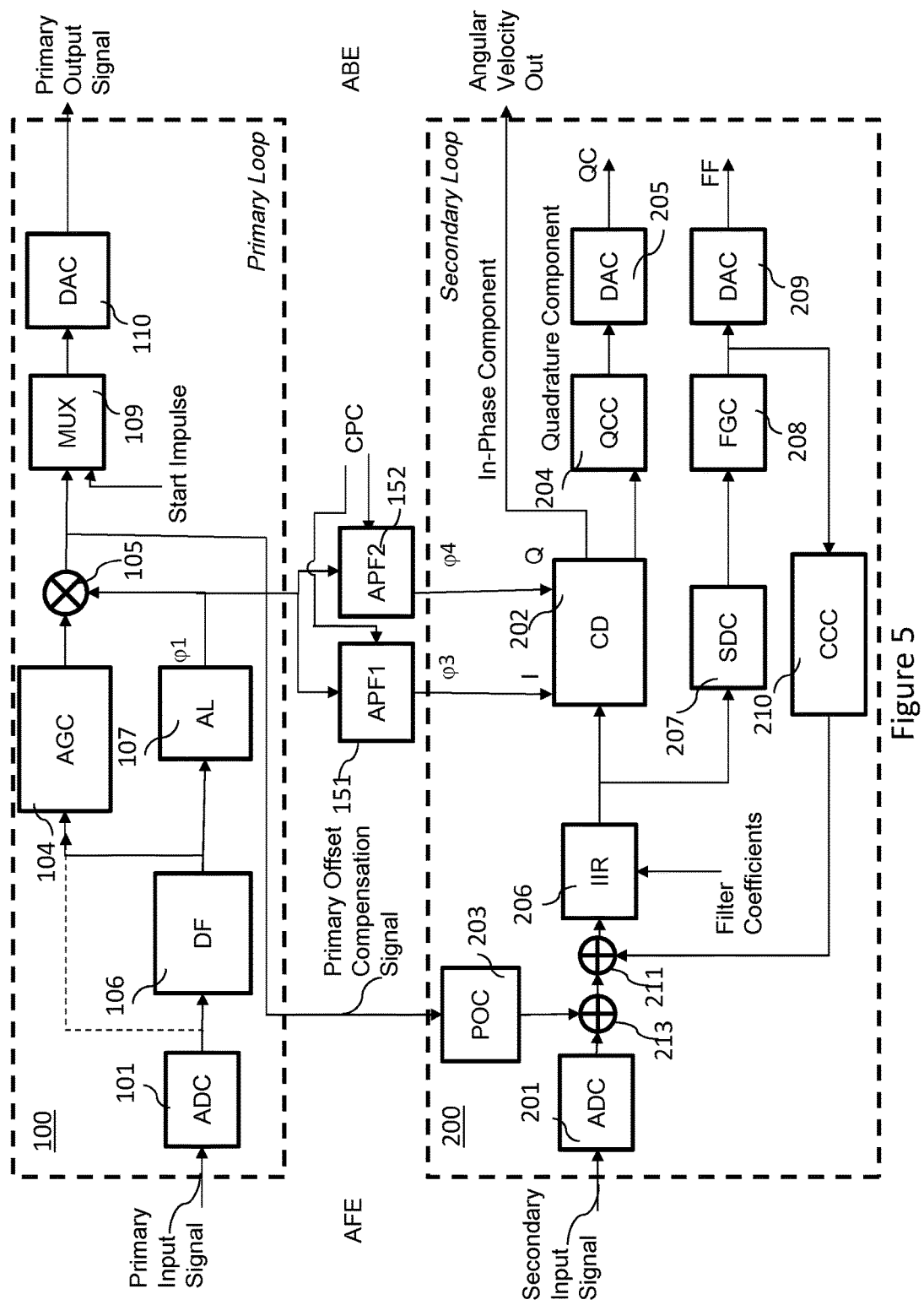
FIG. 5 shows a third exemplary schematic of a digital controller circuitry for a MEMS gyroscope.
Figure 6:
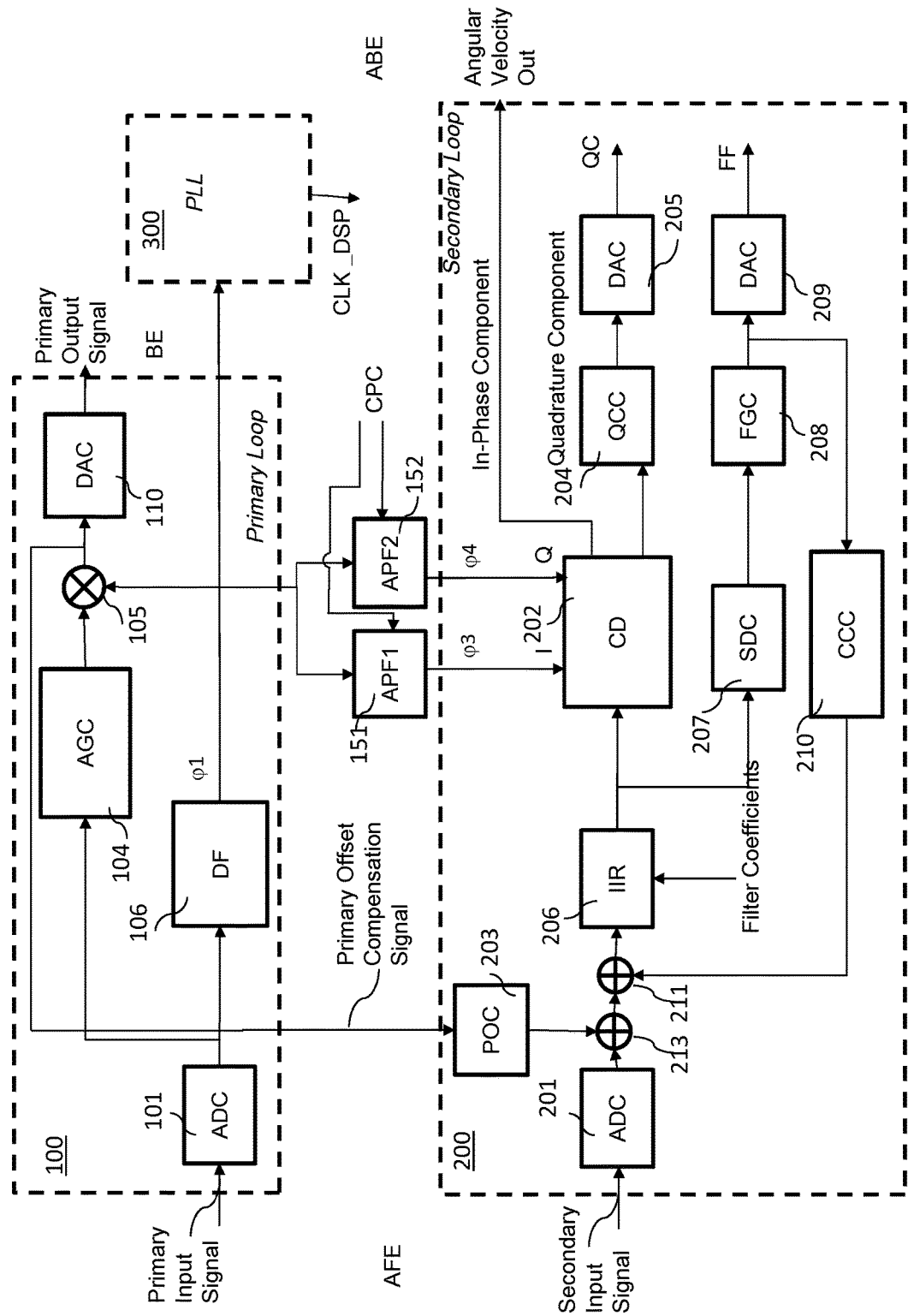
FIG. 6 shows a fourth exemplary schematic of a digital controller circuitry for a MEMS gyroscope.

In embodiments of FIGS. 4, 5 and 6, a force feedback (FF) signal is generated in the digital secondary loop (200) to be used in the analog back end (ABE) for causing a damping force against movements of the secondary element especially on frequencies near or at the resonance frequency $f_{RES}$. A basic functional principle of force feedback loop operation is that of a closed loop configured to change the response function of the digital secondary loop (200) so that amplitude response function of the digital secondary loop (200) is more flat at or near the operating frequency of the resonator. In some embodiments, phase response of the digital secondary loop (200) may also be stabilized by the force feedback (FF) so that the derivative (rate of change) of the phase response of the digital secondary loop (200) changes less dramatically around the resonance frequency of the MEMS element compared to a very steep phase response curve of a digital secondary loop (200) without any force feedback capability on frequencies near to the resonance frequency $f_{RES}$. Details and examples of a force feedback loop will be discussed below under title Force feedback.

Primary Loop

In following description, the primary loop circuitry and various design alternatives for it are described in more detail in connection to FIGS. 3, 4, 5 and 6.

As explained above, the primary signal is caused by the movement of the primary mass, and transformed to an analog electrical signal by the analog front end part (AFE). The analog front end part (AFE) provides a primary input signal, which is received at the input of the digital primary loop (100). This primary input signal is digitized by a first analog-to-digital converter ADC (101) of the digital primary loop (100). The signal received at the output of the first ADC (101) may be called as the digitized primary signal.

A digital DF (106) is used to implement a necessary phase shift in the digital primary loop (100), while the DF (106) at the same time provides attenuation for any unwanted high-frequency noise, such as quantization noise caused by the analog-to-digital converters for example. The digital filter DF (106) may be a low pass filter. The DF (106) in the digital primary loop (100) should be of second or higher order. In the case the digital filter is a low pass filter, the order of the low-pass filter is an even integer number. This is beneficial since at high frequencies, e.g. above frequency $10*f_{RES}$, phase shift caused by the even integer order low-pass filter approaches an integer multiple of 180 degrees and the drive signal therefore cannot deliver power to high-frequency parasitic micromechanical resonances. Preferably, the digital DF (106) comprises an infinite impulse response filter, a.k.a. an IIR filter. A benefit of using an IIR filter as the digital filter (106) is that although both a FIR and an IIR filter provides very accurate phase shift on the resonance frequency, an IIR filter does that without introducing excess delay above the resonance frequency. A FIR typically introduces more delay and a linear phase response, whereas a desirable, approximately constant phase shift on frequencies above the resonance frequency can be attained by using an IIR. Further, an IIR filter can be implemented with less digital ports than a FIR. Thus, choosing an IIR filter as the digital filter (106) reduces area required by the circuitry.

A benefit of using an IIR filter as the digital filter (106) is that an IIR filter provides very accurate phase shift on the resonance frequency even if the resonance frequency varies. Thus, an IIR filter is capable of filtering accurately a range of resonance frequencies in a practical device, where the resonance frequency varies slightly for example due to temperature. Typically, such frequency change is just fractions of a percent from the intended resonance frequency. Although such small variation does not cause major problems in view of driving force needed to drive the primary resonator, it may cause major challenges in demodulation of the secondary, detection signal, which is based on the digitized primary signal. This is because even a slight variation in the resonance frequency of the primary resonator may cause significant phase error between the digitized secondary signal and the digital in-phase (I) and quadrature phase (Q) demodulation signals, which leads to phase error in the sensed angular rate. The DF may also be implemented as a peaking filter, thus enabling increase of amplification of the signal at the MEMS element resonance frequency $f_{RES}$. This increased amplification is accomplished with increased risk of increased phase error when the primary resonance is not ideally at the frequency point where the filter is designed to produce the 90-degree phase delay. The greater the Q-value of a filter, the greater is its phase derivative. A peaking digital filter allows accurate setting of the large gain frequency of the peaking filter, at which the primary element frequency is driven. Preferably, the large gain frequency equals the resonance frequency $f_{RES}$. Thus, using a peaking filter in the primary loop facilitates good isolation of parasitic, unwanted oscillation modes.

The relative phase of the signal received at the output of the DF (106) is marked with φ1. Necessity of a phase delay in the digital primary loop (100) rises from the fact that in order to set the primary mass into a stable oscillation at the resonance frequency $f_{RES}$, the driving force caused by the driving signal generated by the analog back circuitry end (ABE) towards the primary mass shall have an essentially 90-degree phase shift in comparison to the oscillation motion of the primary mass. Term digitized primary signal may refer to the original digitized primary signal or the phase shifted digitized primary signal. The term filtered digitized primary signal refers specifically to the output signal of the digital filter DF (106), which has been phase shifted and filtered by the digital filter DF (106). Use of the digital filter DF (106) for phase shifting beneficially allows omitting of a PLL circuitry for clock generation, as a very accurate phase shift can be achieved on the resonance frequency: a 90-degree phase delay is achieved on the natural frequency of a second order digital low pass filter. Using the same digital low-pass filter for phase shifting in addition to low pass filtering is beneficial, since silicon area of the circuitry required for the digital primary loop is reduced. With a digital low pass filter the −90-degree phase shift (90-degree phase delay) can be made accurately, so that the phase shifted digitized primary signal may be utilized for generating for example demodulation signals needed in the digital secondary loop (200). As known by a person familiar with the art, the drive loop target phase shift at the resonance frequency $f_{RES}$ may be any of 90+180*n−180*pol degrees, where n is an integer number. Also, primary drive signal polarity may be controllable in order to enable oscillation in the drive loop at the resonance frequency. In the equation pol=1 when polarity is inverted and 0 when not. Oscillation will not start or it will be damped if the drive loop polarity is wrong. A polarity inversion may be done within primary AFE (61), at DF (106) output, or it may be accommodated in the multiplier circuit (105). It is also important to consider the effect of polarity control on POC (203) input signal and CD (202) input signals to ensure the correct polarity in these signal paths as well. The functionality of POC (203) and CD (202) is described later in the text.

The digital filter 106 preferably uses a clock that is generated using the primary signal. Filtering the primary signal reduces noise in the clock signal. A benefit from generating the clock from the primary signal is that the clock will follow changes in the primary resonance frequency fRES. Thus, the 90-degree phase shift frequency also follows changes in the primary resonance frequency, which reduces need to adjust coefficients of the digital filter 106. The clock may be generated directly from the filtered digitized primary signal, or a stable system clock may be provided by a PLL receiving the filtered digitized primary signal as input.

The same digital filter DF (106) may also be configured to limit quantization noise from the ADC (101). Quantization noise could originate from use of a sigma-delta oversampling ADC for digitizing the analog primary signal. In this case both requirements, namely phase shifting the resonance frequency component $f_{RES}$ by 90 degrees and limiting quantization noise in the digital primary loop before the digital primary signal is used for any further signal processing where the quantization noise could have adverse effects, can be achieved with the single digital filter DF (106).

Even further, the same digital filter DF (106) in the primary loop may provide compensation both for changes in the resonance frequency due to temperature and for changes of a primary system clock in case a PLL is used for generating such. Such frequency compensation may be achieved through adjusting filtering coefficients of the digital filter DF (106).

Automatic gain control circuitry AGC (104), detects the total alternating amplitude level of the digitized primary signal, which corresponds to amplitude of the primary input signal, and continuously controls the signal level of the primary output signal based on the detected amplitude. Term total amplitude in this connection indicates that the amplitude level (which may correspond to a current or a voltage amplitude) does not refer to any specific amplitude component of the digitized primary signal. The AGC (104) may provide a control signal for a digital multiplier element (105), which multiplies the digital AC signal received from the DF (106) having set phase φ1 to form a digital primary AC signal. The digital primary AC signal is then converted to the analog primary output signal in a first digital-to-analog converter DAC (110) and fed to the analog back end (ABE) for further processing the signal and feeding the processed signal as a primary drive signal towards the primary mass. In capacitive gyroscopes, especially where near mode match, in which the initial target is set to be exact mode match, but in which mode match is not actively controlled, this implementation may be feasible. Mode match means that the resonance frequency of the primary and secondary masses is the same. When the primary amplitude is controlled by the AGC (104), the AC component of the drive is minimized, which is feasible in a near mode match gyroscope. This is due to the fact that the cross-coupling phase, when compared with the capacitive Coriolis phase secondary signal, may not be known. Use of the multiplier circuitry (105) may be particularly useful also when piezoelectric excitation is used for the primary mass, in other words, when the primary output signal is used for driving a piezoelectrical actuator.

FIG. 3 illustrates two options for obtaining input signal to the AGC (104). In a first option, illustrated with a solid line, this input signal is obtained after the phase shifting is performed to the digitized input signal with the digital filter DF (106). This option enables reducing noise in the signal received by the AGC (104), while the DF (106) filters any high frequency noise in the digitized input signal.

FIG. 3 shows also an alternative solution where input signal for AGC (104) is the digitized primary signal prior to phase shifting with the digital filter DF (106). This alternative is illustrated with a dashed line. This alternative, any effects on gain control caused by possible variations in the DF (106) sensitivity are avoided. In a yet further alternative (not shown), the digitized primary signal may be squared and the resulting DC component after filing may be utilized as amplitude information in the AGC (104). A benefit of such alternative is that it reduces noise caused by the gain control.

It is beneficial to implement the amplitude detection in AGC (104) without utilizing coherent detection, as this way no PLL is required for robust start-up of the drive loop.

Selecting between the two options for AGC (104) input signal may be affected if no PLL is used for drive loop operation. This is due to a fact that synchronous detection may not be available without a PLL and thus out-of-band signals at AGC input may affect the AGC operation. It might therefore be more feasible to take the AGC input from the output of DF (106), which may also limit the signal band. On the other hand, due to asynchronous operation, the DF (106) likely also operates out of the ideal target phase shift frequency, but still within a frequency range where drive force is sufficient. If this causes excessive imprecision in the primary target amplitude at the LPF output, the AGC input taken prior to LPF may be the more feasible alternative.

It is beneficial to use a digital multiplier element (105) in the digital primary loop (100) when DC rotor bias voltage is high, for example in range from 5V to 25V, as high DC bias enables use of a low voltage in the primary drive signal. In this case, the amplitude of the AC drive signal may be for example 0.6V and in any case well within nominal 1.8V supply rails, so that the high DC rotor bias may be up to 20 times higher than the highest AC drive signal amplitude. Omitting high voltage drive, typically needed for drive DC control if no high DC bias is used, reduces silicon area required by the primary loop circuitry. Primary drive loop induced offset (a.k.a primary induced offset) and noise in the secondary signal is relatively straightforward to compensate in this arrangement. Offset compensation will be described in more detail later.

In a yet further alternative embodiment, the AGC (104) provides a DC signal, which is combined with the AC signal with phase φ1 in a digital summing element placed in the circuitry instead of the multiplier (105) to form the digital primary AC signal. Despite the likely required high-voltage drive, this option may be feasible, when constant cross-coupling path between drive and secondary sense is the dominating rate offset source. DC control allows the offset to be stabilized as the AC portion remains constant.

The implementation of FIG. 3 with a DF (106) in the digital primary loop may require high gain during system start-up, because the drive signal is generated directly from the detected primary signal and this signal is initially weak during start-up when the motion of the primary mass has small amplitude. In order to allow the DF (106) to have a higher gain in order to fulfill required start-up amplification needs, an amplitude limiting circuitry AL (107) is introduced in this first embodiment for limiting amplitude of the digitized primary signal when sufficient amplitude has been achieved during start-up and naturally also during normal operation of the device, so that amplitude of the digitized primary signal is maintained on linear range of the circuitry. Such amplitude limiting circuitry AL (107) may comprise for example a logarithmic scaler or a simple right shifting element for data bits, which limits the amplitude of the digitized primary signal provided at the output of the DF (106) when a predetermined signal threshold level at DF (106) output is reached. Further, the amplitude limiting circuitry AL (107) may be configured to increase gain of the digital primary loop during start-up, when the primary input signal level is below the predetermined signal threshold level at DF (106) output. In other words, the amplitude limiting circuitry AL (107) controls the amplitude of the digital primary drive AC signal. Such simple amplitude limiting circuitry AL (107) provides a very cost effective way to enable fast and reliable start-up. Phase shift in the amplitude limiting circuitry AL (107) is insignificant and has therefore only minor effect on the phase of the signal, and thus the phase φ1 of the signal at the output of the AL (107) is defined by the phase response of the DF (106). Further possible arrangements for start-up arrangements will be described later.

In the embodiment of FIG. 3, out-of-band gain of the DF (106) may be designed to be only slightly higher or even lower than the gain at resonance frequency of the primary mass $f_{RES}$.

In the embodiment of FIG. 3, start-up of the primary element may be simply caused by a small stimulus caused by noise originating from switching on the electrical circuitries. Such start-up process without a specific start-up stimulus is relatively slow, and requires relatively high resolution capability of the first analog-to-digital converter ADC (101), so that the minimal motion caused by noise does not disappear between the quantization levels of the ADC (101).

In the embodiment illustrated in FIG. 4, the digitized primary signal is fed to a digital filter DF (106) through a multiplexer circuitry MUX (109). In this embodiment, the digital filter is preferably a low pass filter. Purpose of the multiplexer circuitry (109) is to enable provision of a start-up impulse towards the digital primary loop (100) for start-up purposes. Start-up is implemented by controlling the MUX (109) in start-up so that a digital pulse form signal is fed to the digital primary loop (100) through an input of the MUX (109), which causes the digital primary loop (100) and the analog back end circuitry BE to generate an initial driving force towards the primary mass (not shown), causing it to start moving in oscillating motion. The digital pulse form signal may comprise a single impulse sample, in other words a digital value with non-zero value, or other suitable waveform such as a digital presentation of a defined voltage step or a pulse response is fed towards the input of the digital filter DF (106). This causes the DF (106) to output a signal according to its impulse response. This output signal comprises also frequency components both equal to and in the vicinity of the natural frequency $\omega_0$ of the DF (106). When this natural frequency $\omega_0$ is matched with the resonance frequency of the MEMS element, this start-up impulse signal causes start-up of MEMS resonator oscillation at the resonance frequency $f_{RES}$. During normal operation, the digitized primary signal is simply fed through the multiplexer circuitry MUX (109), which has no effect on the signal phase or amplitude. Feeding of a start-up impulse as a digital pulse form and utilizing the impulse response characteristics of the DF (106) in generation of the initial resonance frequency signal for start-up allows very compact circuitry, yet enabling implementation of an effective start-up. It is also generally known that similar functionality may be achieved by replacing the MUX with e.g a summing element, where during normal operation the signal summed to the digital primary loop is set to be zero.

In a digital circuitry, a start-up impulse as disclosed above is simple and straightforward to implement. Such start-up impulse may be just a small electrostatic step that causes the primary loop to start amplifying the signal created by the electrostatic step at the predefined resonance frequency $f_{RES}$. Would the impulse be fed directly to the primary output signal, it could cause a risk of exciting unwanted resonator oscillation modes due to unlimited bandwidth. It is thus feasible to feed the start-up impulse into the digital primary loop (100) before the DF (106) as is shown in FIG. 4. With a high Q-value, which is preferably over 1 and for example in range from 1 to 4, the 90-degree phase delay and oscillation frequency of the DF (106) are sufficiently close to each other for start-up purposes.

In another embodiment illustrated in FIG. 5, the multiplexer circuitry MUX (109) is placed in the digital primary loop (100) only after the digital summing element (105) and before the first DAC (110). Similarly to the earlier start-up multiplexer embodiment, the purpose of the multiplexer circuitry (109) is to enable provision of a start-up impulse towards the drive loop for start-up purposes. In this second embodiment, the start-up impulse is fed first towards the primary analog back end and the primary mass, causing the primary mass to start moving, which movements reflects in the primary input signal. This alternative may become feasible if the Q-value of the DF (106) is e.g. below unity, in which case it would attenuate the power of the impulse at the resonance frequency in the case of FIG. 4.

Although two specific examples have been disclosed herein, other possible locations in the digital primary loop (100) may be applicable for the multiplexer circuitry MUX (109) for enabling feeding of a start-up impulse in the digital primary loop during start-up state of the device.

The digitized primary signal is also fed into the digital secondary loop (200), which utilizes this signal for enabling compensation of primary induced offset in the secondary signal. In some embodiments, such as the embodiment of FIG. 3, the digitized primary signal is provided to the digital secondary loop only after phase shifting with the digital filter DF (106). In other words, the signal is provided from a primary loop point at which the signal amplitude corresponds to the drive AC signal component, which allows this signal used for offset compensation to match to cross-coupled primary drive AC signal even after AGC control. In another embodiment, such as the exemplary embodiment of FIG. 4, the digitized primary signal is provided towards the digital secondary loop directly from the output from the first analog-to-digital converter ADC (101), in other words prior to phase shifting the digitized primary signal. This digitized primary signal provided towards the digital secondary loop (200) from the digital primary loop (100), before or after phase shifting the digitized primary signal with the DF (106), for purpose of compensating any primary induced offset in the secondary signal is called as primary offset compensation signal. It is however, important to distinguish between offset due cross-coupled drive AC signal, where the signal must be taken after the DF (106), and offset due other sources that are not directly dependent on drive AC signal such as cross-coupling of clock signals within secondary AFE or direct excitation, where the signal is preferably taken prior to the DF (106). The compensation of all room temperature offsets before the IIR (206) of the digital secondary loop ensures that no dynamic range limitation occurs. This kind of arrangement is beneficially enabled by the all-digital design of the primary loop, where tuning and calibration of coupling sensitivity and phase is possible in very small steps, which would not be feasible in analog design.

Although use of a high-quality clock for the digital part enables a digital controller circuitry topology without a digital PLL as shown in embodiments of FIGS. 3, 4 and 5, a high-quality clock source may not always be available, as such high-quality clock is typically available only from external components. On-chip relaxation type oscillators or ring oscillators are typically drifting considerably more than external crystal oscillators. Especially, even slight frequency drift between the element resonance frequency $f_{RES}$ and/or digital filter response might lead to poor performance of the entire MEMS device. For example, a folding tone might be generated in the digital primary loop (100) and/or the digital secondary loop (200) which could even be enhanced by unwanted resonance modes of one or more of moving MEMS masses. If the clocks used in the digital primary loop (100) are not synchronized with the MEMS oscillation, such folding issue may affect any of in-band noise, offset and out-of-band noise, and also changes in performance of the circuit due to varying ambient temperature and circuitry ageing. In practice, it may be difficult to recognize that such issues occur in the device, as appearance of the issue could require special conditions such as specific temperature point.

Proper synchronization may be improved and easily implemented when needed by combining the system clock source such as a relaxation oscillator with tuning capability with noise shaping DACs, which provide a compact interface between digital and analog stages. Thus, synchronous operation may be achieved without the burden of having a complex digital PLL with high system clock frequency requirement. For example, a 5-bit second or third order delta-sigma-DAC may be utilized as a noise shaping DAC in the circuitry according to embodiments. The primary loop digital filter DF (106) may comprise an integrator, which eliminates errors caused by non-linearity of the DAC and any phase error between the primary signal and a system clock. In the digital primary loop (100) illustrated in FIGS. 3, 4, 5 and 6, the frequency response of the DF (106) may be designed so that when the system is started, the start-up succeeds as long as the initial frequency error is not more than 10%. When the input to AGC (104) is taken before LPF, the 10% error causes only decrease of drive force due to fact that DF phase shift is not ideally the −90 degrees and the gain may decrease when high quality factor for the DF (106) is utilized. Limit may be for example that 10% mismatch in initial digital clock cause ten degree (10°) phase error in drive signal which is equivalent to drive force decrease of 1.5%. This has minimum impact on start-up and both the closed drive loop and PLL (300) of FIG. 6 can start independent of each other.

For providing a high-quality clock source for the digital circuitry of the controller, a PLL (300) may be used as disclosed in the embodiment of FIG. 6. This PLL (300) is used just for generating the high-quality DSP master clock signal (CLK_DSP) but it is not part of the closed drive loop circuitry or the digital primary loop (100). Beneficially, the primary loop digital filter DF (106) provides a filtered oscillating input signal for the PLL (300).

Figure 7:
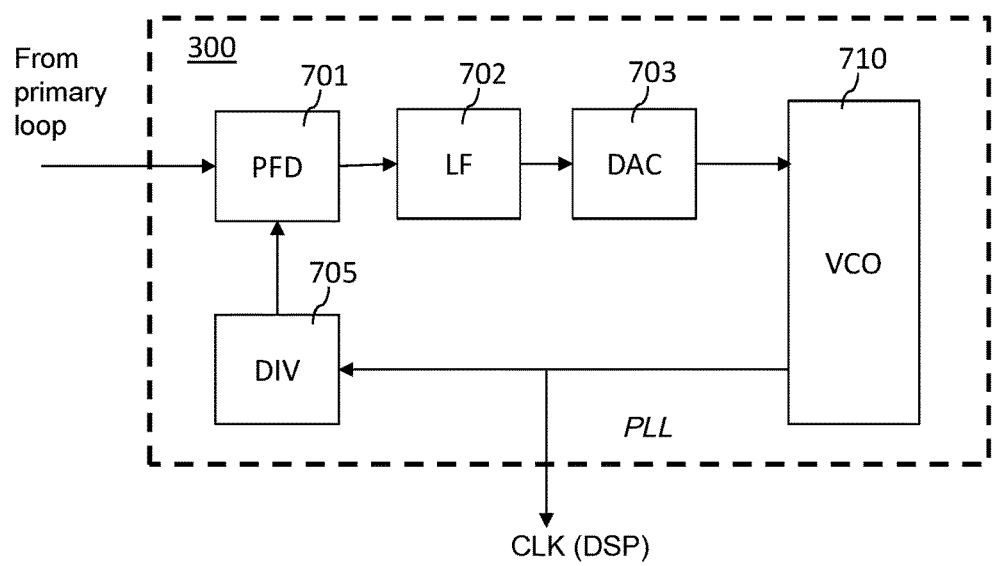
FIG. 7 shows a PLL circuit.

FIG. 7 illustrates in some more detail an exemplary PLL circuitry (300) for providing a synchronized high quality DSP master clock signal CLK_DSP for digital signal processing circuitry. The PLL (300) receives a filtered clock signal (filtered digitized primary signal) from the DF (106) output, which is distortion free as a result of filtering performed by the digital filter DF (106). The phase frequency detector PFD (701) in the PLL (300) compares clock signal received from an analog VCO (710) divided with the clock dividing circuitry DIV (705) with the reference signal from the digital primary loop (100) and produces a varying DC signal with respect to phase and frequency difference between the two inputs. This DC component is utilized after filtering in a loop filter LF (702) to control the VCO (710). When the LPF in the digital primary loop is designed to have 90-degree phase delay at the resonance frequency, but the system starts with an initial error which is at maximum 10 degrees, the error will be removed after PLL locks to the reference frequency. After locking, the secondary synchronous detection and offset cancellation functions precisely, when the PLL provides a precise DSP master clock signal CLK_DSP for the digital control circuitry in both the digital primary and the digital secondary loops. The DSP master clock frequency can be made controllable, so that it can be matched with the resonance frequency even if the resonance frequency changes. Primary loop start-up may be made independent of synchronization of the DSP master clock by ensuring that start-up occurs even when the digital controller circuitry is clocked with a non-synchronous clock in such a way that the frequency settling during start-up has negligible effect on the digitized primary signal level and start-up time.

Demodulation Signals and Calibrated Phase Shifting Coefficients

The digital secondary loop (200) needs an in-phase demodulation signal $I=\sin(2\pi f_{PRIM}T+\varphi_3)$ and an quadrature phase demodulation signal $Q=\sin(2\pi f_{PRIM}T+\varphi_4)=\cos(2\pi f_{PRIM}T+\varphi_3)$ for coherent detection. In embodiments disclosed in FIGS. 3, 4, 5 and 6, all pass filters APF1 (151) and APF2 (152) are placed between the digital primary loop (100) and the digital secondary loop (200) for phase shifting. The demodulation signals for the digital secondary loop (200) are generated by these all pass filters APF1 (151) and APF2 (152) from the filtered digitized primary signal. As known by a person familiar with the art, use of an all-pass filter is simply one alternative for filter realization and for example low-, high-, or band-pass filters are viable options as well especially when offset reduction or high-frequency noise filtering is needed. Alternatively, phase shifting may be implemented with delay lines or any other feasible alternative known in the art. The precise 90-degree phase shift between $\varphi_3$ and $\varphi_4$ may also be implemented with logic circuitry which implements the 90-degree phase shift on the resonance frequency. However, filter option is beneficial as it allows use of low clock frequency in the digital control circuitry and thus further facilitates low power consumption in the digital circuitry, which is one of the goals for the entire design. The phase shift caused by the all pass filters is calibrated using calibrated phase shift coefficients CPC, each all pass filter having its own calibration coefficients, causing the respective all pass filter to cause the intended phase shift for the respective signal. Phase shift between the in-phase demodulation signal I and the quadrature phase demodulation signal Q is essentially 90 degrees. The calibrated phase shift coefficients CPC may be received from a processor such as a CPU, or from registers (not shown). Calibrated phase shift coefficients CPC are preferably obtained during initial calibration of the MEMS device during manufacturing process and stored in registers or memory/memories for later use when the MEMS device is in operation. Different calibrated phase shift coefficients may be calibrated over a range of temperatures to include effects such as variation of the resonance frequency $f_{RES}$, variation of parasitic resistors between element and ASIC, and variation of secondary loop properties.

In embodiments illustrated in FIGS. 3, 4, 5 and 6, the phase shifting all pass filters APF1 (151) and APF2 (152) are logically placed between the digital primary loop (100) and the digital secondary loop (200). It should be understood, that in a practical circuitry implementation these filters may be implemented at any suitable location in the MEMS control circuitry.

Secondary Loop

A secondary signal is caused by the movement of the secondary mass, and transformed to an analog electrical signal by the analog front end circuitry (AFE). The analog front end circuitry provides an analog secondary input signal, which is received at the input of the digital secondary loop circuitry (200). This secondary input signal is digitized by an analog-to-digital converter ADC (201) of the digital secondary loop circuitry (200), which may be referred to as the second ADC (201).

Two basic design alternatives are disclosed for the digital secondary loop (200).

The first embodiment is illustrated in FIG. 3. This first embodiment is a circuitry with no force feedback capability. The digitized secondary signal may be filtered with a first low pass filter (216). As there is no particular need for adjusting phase of the digitized secondary signal for feedback purposes but only to attenuate unwanted high frequencies such as harmonic frequencies above the resonance frequency $f_{RES}$, this first low pass filter (216) may use any digital low pass filter topology. Preferably, the first low pass filter (216) comprises an infinite impulse response (IIR) filter.

In second and third embodiments of the digital secondary loop circuitry (200), a force feedback functionality is included. These embodiments are disclosed in FIGS. 4 and 5 respectively. An embodiment of the digital secondary loop in FIG. 6 corresponds essentially to that of FIG. 5. According to the second and third embodiments, the digitized secondary signal is preferably filtered with a first infinite impulse response filter IIR (206) before handling the digitized and filtered signal by coherent detector circuitry CD (202). Benefit of using an IIR (206) in the digital secondary loop is that multiple purposes may be served with a single filter circuitry. An IIR (206) is needed for force feedback, which requires a 90-degree phase delay of the secondary signal. Thus, area and power is saved. The first infinite impulse response filter IIR (206) generates a −90 degree phase shift to the digitized secondary signal at the resonance frequency $f_{RES}$ of the resonator. Further benefits of using the first IIR (206) are that DC signal level of the digitized secondary signal is maintained, and while the first IIR (206) is essentially a digital low pass filter, harmonic frequencies and noise above the resonance frequency $f_{RES}$ are attenuated. The first IIR (206) is preferably a second or higher order low pass filter. The filter may also be configured as a peaking filter. Although detection of the secondary signal can also be implemented without a 90 degree phase delay, a digitized secondary signal with 90 degree phase delay at the primary frequency is useful for implementing the force feedback functionality in the secondary loop. Force feedback arrangement in the digital secondary loop (200) forms a closed loop topology with the secondary element and secondary front end and secondary back end circuitries. Force feedback and effects thereof will be described in more detail later. The first IIR (206) may additionally be configured to filter any quantization noise caused by the second ADC (201).

The digital secondary loop (200) receives the digital in-phase demodulation signal $I=\sin(2\pi f_{PRIM}T+\varphi_3)$ and the digital quadrature phase demodulation signal $Q=\sin(2\pi f_{PRIM}T+\varphi_4)=\cos(2\pi f_{PRIM}T+\varphi_3)$ from the digital primary loop through a phase shifting circuitry. The demodulation signals are generated from the filtered digitized primary signal. Phases of the I and Q demodulation signals are adjusted by the phase shifting circuitry preferably comprising two phase shifting all pass filters APF1 (151) and APF2 (152) prior to using them for carefully phase aligned down conversion of the digitized and preferably filtered and phase shifted secondary signal, in order to adjust the phase of these signals to phase delays caused by any parts of the MEMS device circuitry, including for example delay of the digital secondary loop analog-to-digital converter ADC (201) and other signal processing, and also delays caused by the primary and secondary mechanical elements that may appear for example due parasitic resistances. It may be noticed that at least the delay caused by the second analog-to-digital converter ADC (201) depends for example on the sampling frequency used by the second ADC (201), and thus the phases of I and Q demodulation signals may need to be adjusted accordingly in order to match their phases with the phase of the digitized and phase shifted secondary input signal according to known instantaneous delays in the circuitry. As indicated earlier, adjustment of the phases of I and Q demodulation signals is controlled by the calibrated phase shift coefficients CPC.

The digital secondary loop (200) according to the embodiment of FIG. 4 further receives the digitized primary signal as primary offset compensation signal from the digital primary loop (100). In embodiments illustrated in FIGS. 5, and 6, the digital secondary loop receives the primary offset compensation signal in form of the digital primary drive AC signal from the output of the multiplier element (105) of the digital primary loop, and in the second embodiment of FIG. 3 the primary offset compensation signal is received from the output of the amplitude limiting circuitry AL (107). Independent of the exact point of obtaining the digitized primary signal from the digital primary loop (100), we can call this signal provided for the digital secondary loop for performing primary induced offset compensation for the secondary signal as the primary offset compensation signal.

Before feeding the digitized secondary signal towards the coherent detector, this primary offset compensation signal is processed in order to enable compensating any primary drive induced secondary offset, i.e. any offset that correlates between the primary drive signal and the secondary signal and consequently also noise in the secondary signal caused by noise in the digital primary AC drive signal. Offset compensation may be implemented by subtracting a suitably delayed and scaled primary offset compensation signal from the digitized secondary signal in a subtraction (summing) element (213). Delaying and scaling of the primary offset compensation signal is implemented with primary offset compensation circuitry POC (203). One result of primary drive induced secondary offset compensation is that various crosstalk related errors in the secondary signal may be reduced. Further, the primary drive induced secondary offset compensation reduces offset errors in a detected in-phase magnitude signal indicating the detected angular velocity. Circuitry and method for processing the primary offset compensation signal will be discussed in more detail later in relation to FIG. 15.

The coherent detection circuitry CD (202) provides in one of its outputs a demodulated in-phase component of the secondary signal, which in-phase component signal provides information on the detected angular velocity the gyroscope is subject to. This in-phase component signal may be provided as a digital signal in the respective digital secondary loop output (Angular Velocity Out) for further processing. In addition, the coherent detector circuitry CD (202) may provide in its output a demodulated quadrature component of the secondary signal, which may be used for quadrature compensation after suitable signal processing has been applied within the digital secondary loop (200) and the secondary analog back end circuitry (ABE).

If the digital secondary loop circuitry (200) is configured to produce a quadrature compensation signal, the quadrature component of the secondary input signal obtained from the coherent detector circuitry CD (202) may be further processed with a quadrature compensation controller circuitry QCC (204). The quadrature compensation controller circuitry QCC (204) is configured to extract the quadrature component in the quadrature phase component of the demodulated secondary signal. The QCC (204) may be implemented by as an integrator circuitry, configured to integrate the quadrature component of the demodulated secondary signal. A digital-to-analog converter DAC (205) finally converts the digital quadrature compensation component signal into an analog quadrature compensation signal (QC), which may be fed to the analog back end circuitry (ABE) for further feeding the quadrature compensation signal (QC) back towards capacitive quadrature compensation electrodes arranged operationally with the secondary element in order to remove or reduce the quadrature movement of the secondary mass.

In the embodiments illustrated in FIGS. 5 and 6, the digital secondary loop (200) further includes cross-coupling compensation circuitry CCC (210). Cross-coupling compensation forms a feedback loop within the digital secondary loop circuitry (200). The cross-coupling compensation CCC (210) enables controlling dynamic response of the secondary loop, and compensating for cross-coupling occurring between secondary back end (ABE) and secondary front end (AFE). Digital implementation of the cross-coupling compensation can comprise a simple scaling function, which may even change polarity of the feedback signal. Digital implementation of this cross-coupling compensation is area efficient when compared to a like feedback in an analog secondary loop, which would require a number of analog capacitors and precise resistors.

Force Feedback

As illustrated in FIGS. 4, 5 and 6, the digital secondary loop (200) may comprise digital force feedback circuitry for generating a force feedback signal (FF) in the digital secondary loop (200). The force feedback signal (FF) is fed towards the secondary element through the analog back-end circuitry. This force feedback signal (FF) is used for adjusting the response function of the secondary loop so that amplitude response function of the secondary loop is flatter at or near the resonance frequency of the resonator. Thus, the force feedback functionality stabilizes the secondary loop.

The force feedback signal (FF) generation starts from the digitized secondary signal by filtering it preferably with a second or higher order peaking infinite impulse response filter circuitry IIR (206). Preferably, the infinite impulse response filter circuitry IIR (206) is of second order. A second order filter requires small chip area and causes little delays in the digitized secondary signal. If implemented in a signal processor, this implies a correspondingly fewer number of calculations per time step compared for instance to a FIR filter, thus providing computational savings and reduced delays. In addition, as explained earlier, an IIR provides accurate phase shift on a range of resonance frequencies and causes only small delays above the resonance frequency and small circuitry area, whereas a FIR would provide an accurate phase shift at the resonance frequency, but with greater delays and bigger circuitry area. A set of filter coefficients is calculated for configuring the Q-value of the IIR filter circuitry (206) on wanted level, and suitably adjusting the peak frequency of the IIR filter circuitry (206). In addition to resonance frequency $f_{RES}$ as such, ambient temperature may be a parameter affecting these filter coefficients. This is because temperature may change the resonance frequency $f_{RES}$ of the mechanical resonator. Different coefficients may be defined based on changes of the resonance frequency $f_{RES}$. Defined filter coefficients may be stored in memory(ies) or register(s) and provided to the filter from the memory or registers or from a CPU. On the resonance frequency $f_{RES}$, the IIR filter circuitry (206) changes the phase of the signal by 90 degrees. This 90 degree phase delay with respect to phase of the secondary, detection motion of the secondary mass is required for force feedback signal. Direct current (DC) level of the incoming digitized secondary signal remains unchanged in the IIR filter circuitry (206), and frequencies above the primary frequency are damped. An additional benefit of using the IIR filter (206) in the force feedback loop is that the phase shift caused by the peaking IIR filter approaches 180° on frequencies above the resonance frequency, and this phase shift does not vary significantly over a wide frequency range. For example, with a Q-value of 1, the phase shift of a peaking IIR filter exceeds 170 degrees on frequencies more than $6*f_{RES}$, and the phase shift remains within 180°±10° over a frequency range of over a decade of frequencies. With Q-value of 5, the phase shift of the peaking IIR filter exceeds 170 degrees on a frequency of $2*f_{RES}$ already, and likewise remains 180°±10° over a frequency range of over a decade of frequencies above $2*f_{RES}$.

The technical benefit of the above described phase response is that a signal with essentially 180° phase shift is not capable of causing any unwanted oscillation modes in the mechanical resonators.

A further possibility for chip area and computational savings is provided if the same digital IIR filter is used for both the primary and the secondary loop. This may be implemented by doubling the clock speed of the digital IIR filter.

The IIR filter 206 preferably uses a clock that is generated using the primary signal. Filtering the primary signal reduces noise in the clock signal. A benefit from generating the clock from the primary signal is that the clock will follow changes in the primary resonance frequency $f_{RES}$. Thus, the 90-degree phase shift frequency also follows changes in the primary resonance frequency, which reduces need to adjust coefficients of the digital IIR filter. The clock may be generated directly from the filtered digitized primary signal, or a stable system clock may be provided by a PLL receiving the filtered digitized primary signal as input.

Optionally, the force feedback loop may comprise a secondary delay compensation circuitry (207). If sampling rate used in digital secondary loop circuitry (200) is high and respective sampling delay is below one degree as equivalent phase delay at $f_{RES}$ and/or there are no delay introducing filters in AFE/ABE sections of the secondary loop, the secondary delay compensation circuitry (207) may be omitted.

A third digital-to-analog converter DAC (209) converts the digital signal into the analog force feedback signal (FF) suitable to be fed towards the secondary analog back-end circuitry (ABE) and to be used to cause a feedback force to be caused on the secondary mass of the MEMS element.

Figure 8:
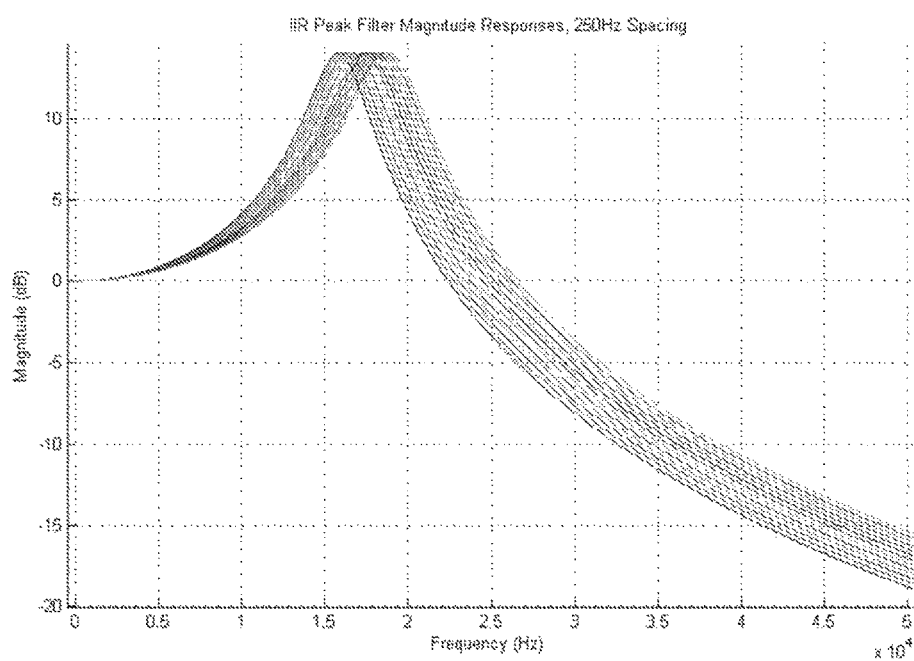
FIG. 8 illustrates peaking IIR filter magnitude responses.

FIG. 8 illustrates a number frequency response curves of a peaking IIR filter circuitry (206). In the FIG. 8, the response curves of a peaking IIR filter have been illustrated with 250 Hz intervals. In a practical device, in order to set the operation parameters of the peaking IIR filter circuitry (206) precisely, filter coefficients may be calculated with for example 1 Hz or preferably 10 Hz intervals, so that the peaking frequency of the IIR filter circuitry (206) may be configured to match the resonance frequency $f_{RES}$ with high precision. As known by a person familiar with the art, temperature of a mechanical resonator likely affects the resonance frequency. Thus, the operation parameters of the peaking IIR filter circuitry (206) may be dependent on temperature, and temperature may be used as one selection parameter for the filter coefficients.

Figure 9A:
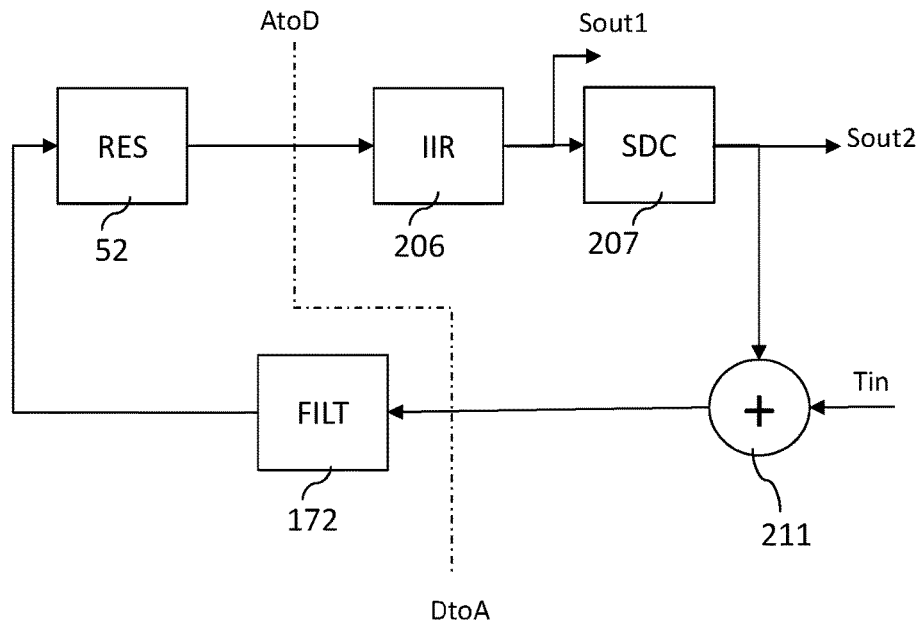
FIG. 9a shows selected elements of a secondary sense loop.

FIG. 9a illustrates a simplified schematic diagram of main elements of the force feedback loop and especially those elements which have frequency dependent transfer functions. These comprise the secondary element (52), the secondary loop IIR (206), the secondary delay compensation circuitry SDC (207), and analog filters FILT (172) in the analog back end circuitry (ABE). The secondary input signal, an electrical signal received from the secondary element (resonator) is preferably in continuous time, and it is digitized (AtoD) by the second ADC (201) shown in FIGS. 3, 4, 5 and 6, before the digitized secondary signal is fed to the first IIR (206) in the digital domain for phase shifting. Further in the digital domain, a secondary delay compensation circuitry SDC (207) adjusts delay of the force feedback signal before the signal is converted to an analog force feedback signal (FF) in the third DAC (209, DtoA). A test input summing element (211) may be provided in the force feedback loop for testing purposes at any location between the secondary delay compensation SDC (207) and the third DAC (209, DtoA) feeding force feedback signal (FF) to the analog back end circuitry. This summing element is not shown in FIGS. 3 to 6 as this element is not used during normal operation of the MEMS device. Schematic of FIG. 9a also indicates alternatives for test outputs configured to provide a result signal for testing of the force feedback loop. Test output $S_{out1}$ corresponds to the digitized secondary signal fed towards the coherent detector circuitry CD (202) after it has been phase shifted with the peaking IIR filter (206). Test output $S_{out2}$ represents signal at the output of the secondary delay circuit SDC (207).

Figure 9B:
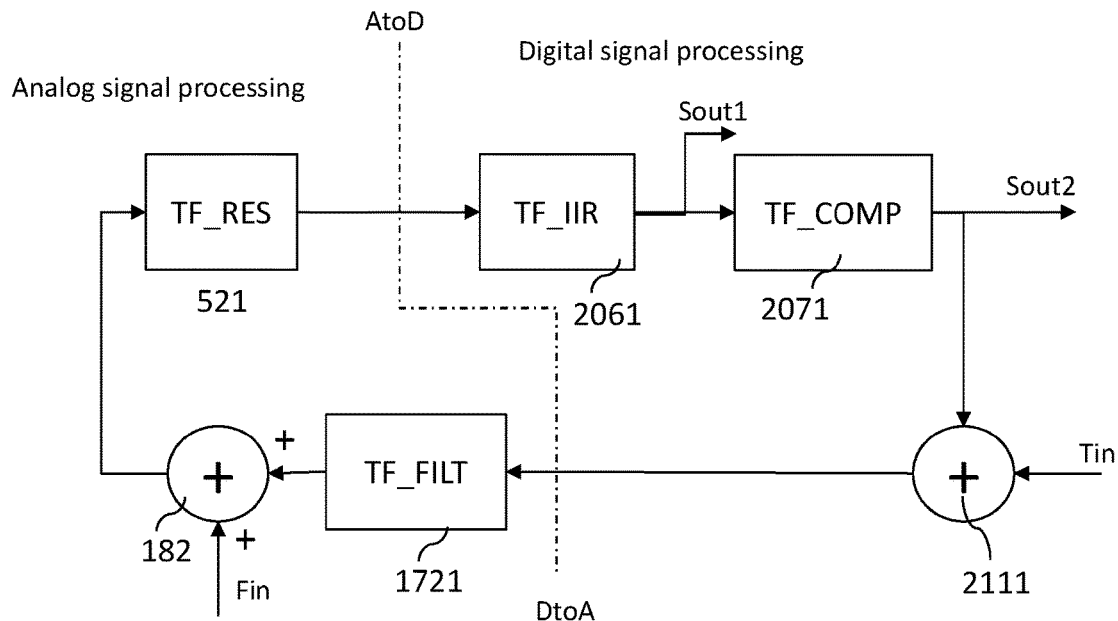
FIG. 9b illustrates some of secondary sense loop circuit element transfer functions.

FIG. 9b respectively illustrates transfer functions of the elements illustrated in FIG. 9a. Compared to FIG. 9a, another "element" is shown, namely a summing element (182), which represents the mechanical forces affecting the secondary mass is added in FIG. 9b. Transfer functions of a mechanical resonator TF_RES (521) representing the secondary element, and the analog back end filters TF_FILT (1721) are in an analog domain, while transfer functions TF_IIR (2061) representing the second infinite impulse response filter and TF_COMP (2071) representing the secondary delay compensation circuitry are in a digital domain. Naturally, the forces affecting the secondary mass of the secondary element are analog and occur in the analog domain as illustrated with summing function 182, whereas in the exemplary arrangement also the test signals are added in digital domain as illustrated with the signal summing function (2111). In this example, the resonance frequency $f_{RES}$ of the resonator is at $10^5$ rad/s.

Figure 10:
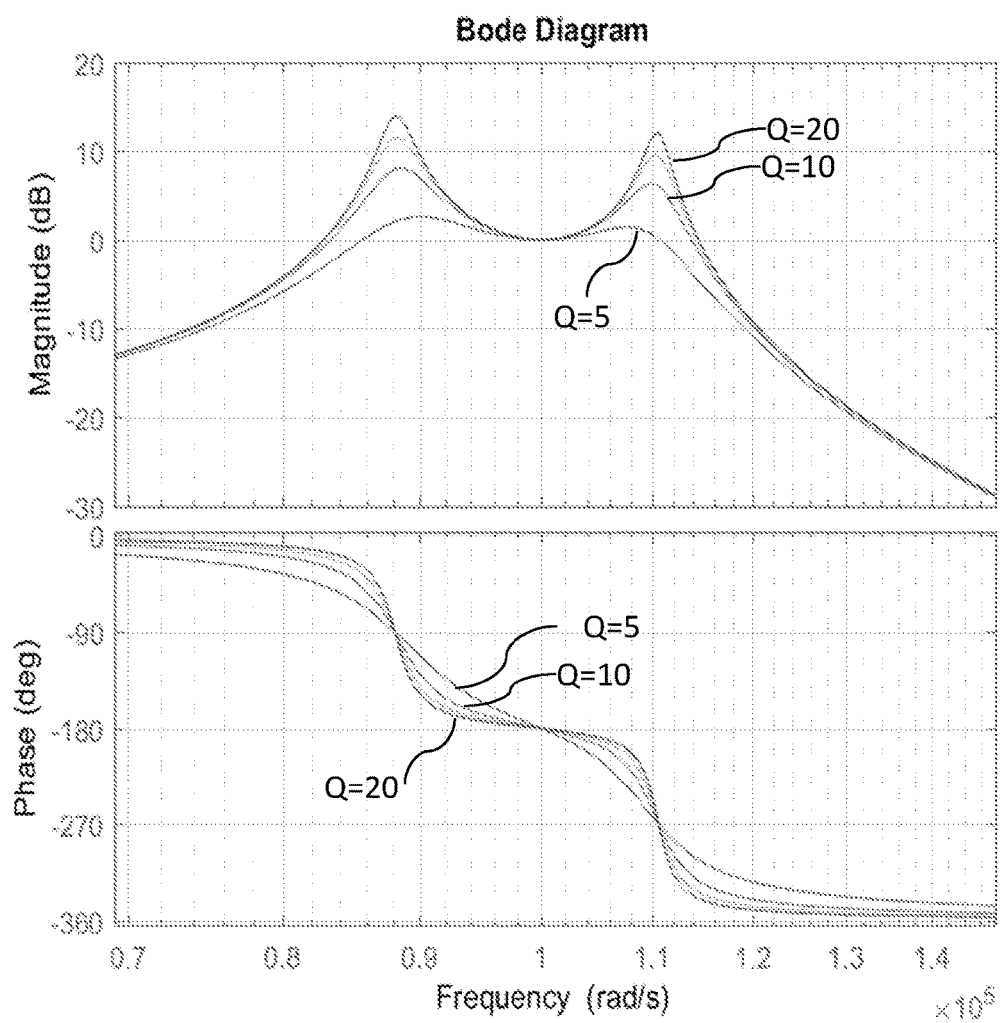
FIG. 10 illustrates a transfer function of a mechanical resonator and a LPF filter operating in closed loop.

FIG. 10 illustrates bode diagram a combined transfer function of a loop with only a mechanical resonator (TF_RES) representing the secondary element and an IIR (TF_IIR) with input signal $T_{in}$ and one of the output signals $S_{out1}$ and $S_{out2}$. Curves corresponding to four different Q-values (5, 10, 15 and 20) of the IIR low pass filter are plotted in the diagram, although just Q=5, Q=10 and Q=20 Q-value are identified in the diagram. The higher the Q-values, the smaller the derivative of phase is at the resonance frequency, which is shown by the flattening phase response curve around the resonance frequency. Q-values may be selected based on wanted design parameters. Secondary IIR Q-value may preferably be within range from 1 to 30. When fast settling time is expected for the secondary loop, the Q-value of the secondary IIR is preferably within range from 1 to 3. Small derivative of phase at the resonance frequency is beneficial since the broader signal band at which the phase shift is at about the wanted level, the higher is the tolerance to frequency mismatch between the drive and sense, in other words the primary and secondary motions. In other words, precise frequency matching of the primary loop and the secondary loop becomes less important. Increasing the Q-value of the IIR filter allows the phase derivate to be kept at an equally low level while reducing out-of-band gain. It should also be noticed that DC gain of the loop is always below unity in order to prevent oscillation, while DC feedback is positive and the −90 degree phase shift at both the mechanical resonator (secondary element 52) and IIR (206) ensure negative feedback at $f_{RES}$.

Despite the fact that Q-values plotted in the graph are all well above unity, which is the preferred option, lower Q-values are feasible in some cases as well. If the Q-value of the IIR is lowered, to e.g. range 1-3, the phase derivative increases at $f_{RES}$, but on the other hand the near resonance out-of-band gain can be lowered so that there is no peaking. This can be observed already with Q-value of 5, where this out-of-band gain is significantly lowered. Thus, the secondary loop IIR low-Q range of 1-3 may provide a viable alternative for conditions, where very fast settling time is required for the secondary loop, while potentially increased high-frequency gain is well tolerated and no parasitic modes are excited.

Figure 11A:
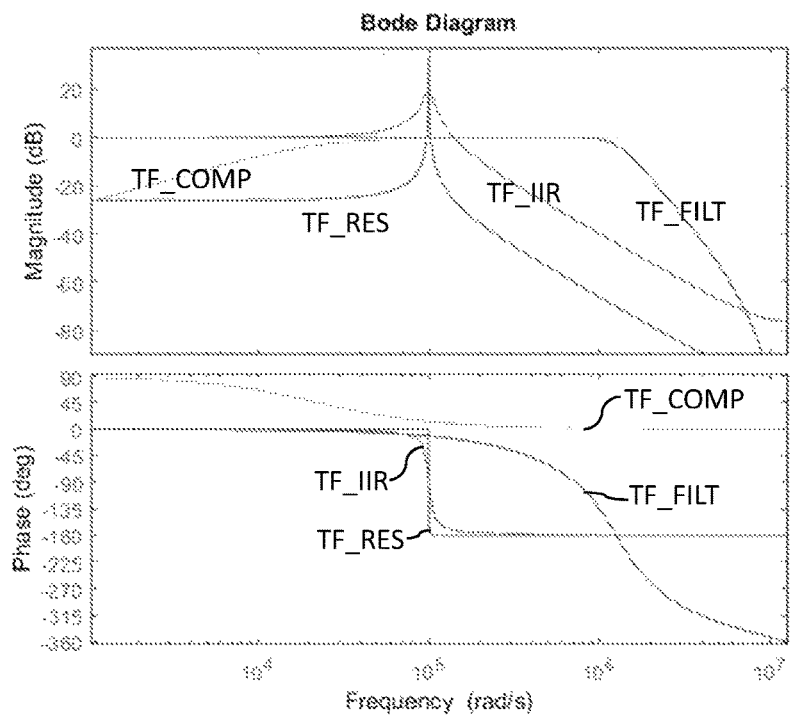
FIG. 11a shows a bode diagram of separate transfer functions of some secondary sense loop circuit elements.

FIG. 11a represents a Bode diagram with separate transfer functions of elements illustrated in FIG. 9b. Magnitude transfer function of the mechanical resonator RF_RES representing the secondary element has a clear peak at the resonance frequency $f_{RES}$, and transfer function of the IIR filter TF_IIR is also set to peak at the resonance frequency $f_{RES}$. An important feature for the implementation of the force feedback is that at this frequency, the phase response of the IIR filter TF_IIR is rather close to that of the mechanical resonator. Analog filters in the back-end are configured mainly to filter out high frequencies, for example quantization noise, clearly above the resonance frequency $f_{RES}$, and thus the phase response of the analog filters TF_FILT causes just slight changes with the phase of the signal at the resonance frequency. Transfer function of secondary delay compensation TF_COMP can be modeled as a high pass filter configured to remove DC signal, and while the phase shift of a high pass filter is in opposite direction to the low pass filters, transfer function of secondary delay compensation TF_COMP may be configured to compensate slight phase shift caused by the analog filtering TF_FILT.

For force feedback purposes, the total loop transfer function shall have a −180 degrees phase shift, in other words, a 180 degree phase delay at the resonance frequency $f_{RES}$. This phase shift is achieved with the peaking transfer function of the resonator TF_RES and the IIR filter TF_IIR. No further phase inversions are thus needed or allowed. Frequency matching of the primary and secondary resonance frequencies is essential, because the sensor loop, forming in essence a Coriolis accelerometer, has the highest signal providing operating region at the secondary resonance frequency.

Figure 11B:
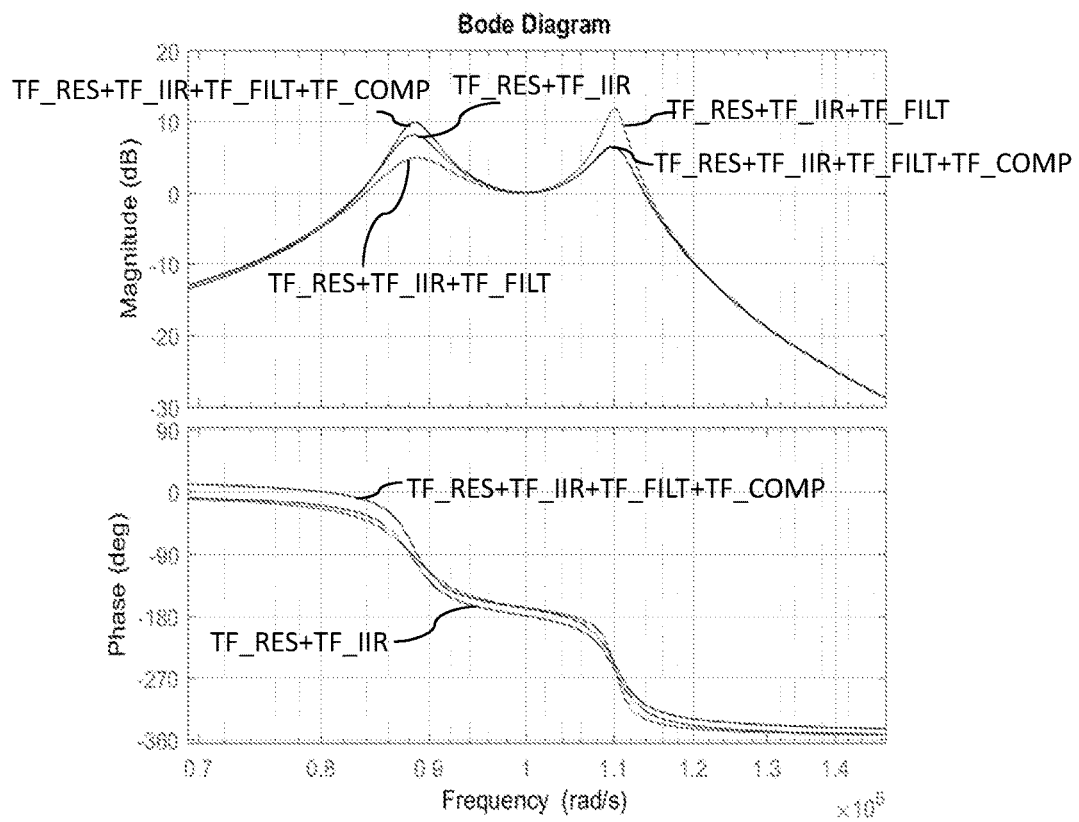
FIG. 11b shows a bode diagram of closed loop transfer functions of some secondary sense loop circuit elements.

A Bode diagram illustrating combined closed loop transfer function of the force feedback loop from $T_{in}$ to $S_{out1}$ or $S_{out2}$ can be seen in FIG. 11b with different Q-values for the IIR. Effect of introducing effects of analog filtering TF_FILT may be seen in the curves. The gain at frequencies above resonance frequency $f_{RES}$ increases, when TF_FILT affects to the loop. By adding the high-pass filter TF_COMP in the loop, the gain at frequencies above resonance frequency $f_{RES}$ returns to similar level as without TF_FILT. Gain below resonance frequency $f_{RES}$ only slightly peaks over the original "middle" peak achieved with TF_FILT and TF_IIR only. A combined transfer function of the secondary loop with transfer function elements TF_RES, TF_IIR, TF_COMP and TF_FILT may have a slightly smaller phase shift at the resonance frequency $f_{RES}$ compared to an "ideal" circuit with only transfer function of a resonator TF_RES and a phase shifting element TF_IIR. Combined phase transfer function and thus step response of the combined transfer functions of a circuit with all phase shifting elements of FIG. 11b provides the force feedback loop with a settling time nearly at the same level to the combination of a resonator TF_RES and filter TF_IIR only.

Increasing the quality factor (a.k.a quality value, Q-value) of the IIR allows a smaller gain at out-of-band frequencies to be utilized. This makes the secondary loop less prone towards oscillation on unwanted, parasitic modes. Digital design enables a reliable filter with high quality factor, while implementation of an analog filter with similar phase response would be very difficult to accomplish. In an analog filter design, a significant variation in Q-value should be allowed, which would again be problematic.

Figure 12:
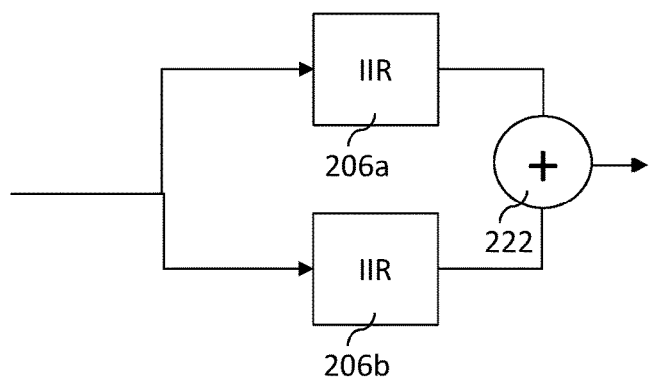
FIG. 12 illustrates an embodiment of an LPF filter.

Digitalization of the secondary loop brings also further flexibility in the secondary loop circuit design. An even broader low derivative phase response band may be achieved by arranging not one, but two second order IIR filters in parallel, and configuring the two IIR's otherwise similarly, but with a slight difference (i.e. 800 Hz) in the natural frequency of the filter, centering the average of the natural frequencies of the two IIR's at the resonance frequency of the system. Such alternative configuration is illustrated in FIG. 12 with parallel IIR's (206a, 206b), which could be used to replace the single IIR (206). Natural frequency of the first IIR (206a) may be set for example to $f_{RES}+\Delta f$ and natural frequency of the second IIR (206b) may be set to $f_{RES}-\Delta f$. As known by a person familiar with the art, natural frequency of a low pass filter equals to the frequency at which the phase shift caused by the filter is −90 degrees. An arrangement with parallel IIR's allows an even lower out-of-band closed loop resonance gain, while also the gain variation at the vicinity of the resonance frequency is lowered. A summing element (222) is needed in the output of the two parallel filters for combining the output signals.

In order to take further advantage of the digital force feedback loop, requirements set to the second analog-to-digital converter ADC (201) may be alleviated. A discrete-time sigma-delta ADC is a feasible alternative for the second ADC (201), but a continuous-time sigma-delta ADC may be even better. This is because the continuous-time sigma-delta ADC could be directly interfacing the MEMS resonator so that high voltage detection DC bias can be taken advance of, while minor non-linearity due to ADC internal feedback is reduced efficiently by high loop gain at resonance frequency. Thus, a reduced number of gain increasing circuitry is required before analog-to-digital conversion. With a sufficiently high voltage detection DC bias and a continuous-time sigma-delta ADC even a solution with unity gain in the secondary analog front-end may be implemented, in other words a solution with no additional gain increasing circuitry before the analog-to-digital conversion may be achieved.

As delay requirements of the digital secondary loop circuitry (200) easily become tight in order not to considerably affect the closed-loop dynamics, Nyquist type analog-to-digital (ADC) and digital-to analog (DAC) converters easily cause a major part of current consumption of the entire digital controller circuitry. In applications where the power consumption is a critical factor, one viable alternative solution is to use oversampling data converters for both analog-to-digital and digital-to-analog conversion. This approach is illustrated in FIG. 13.

Figure 13:
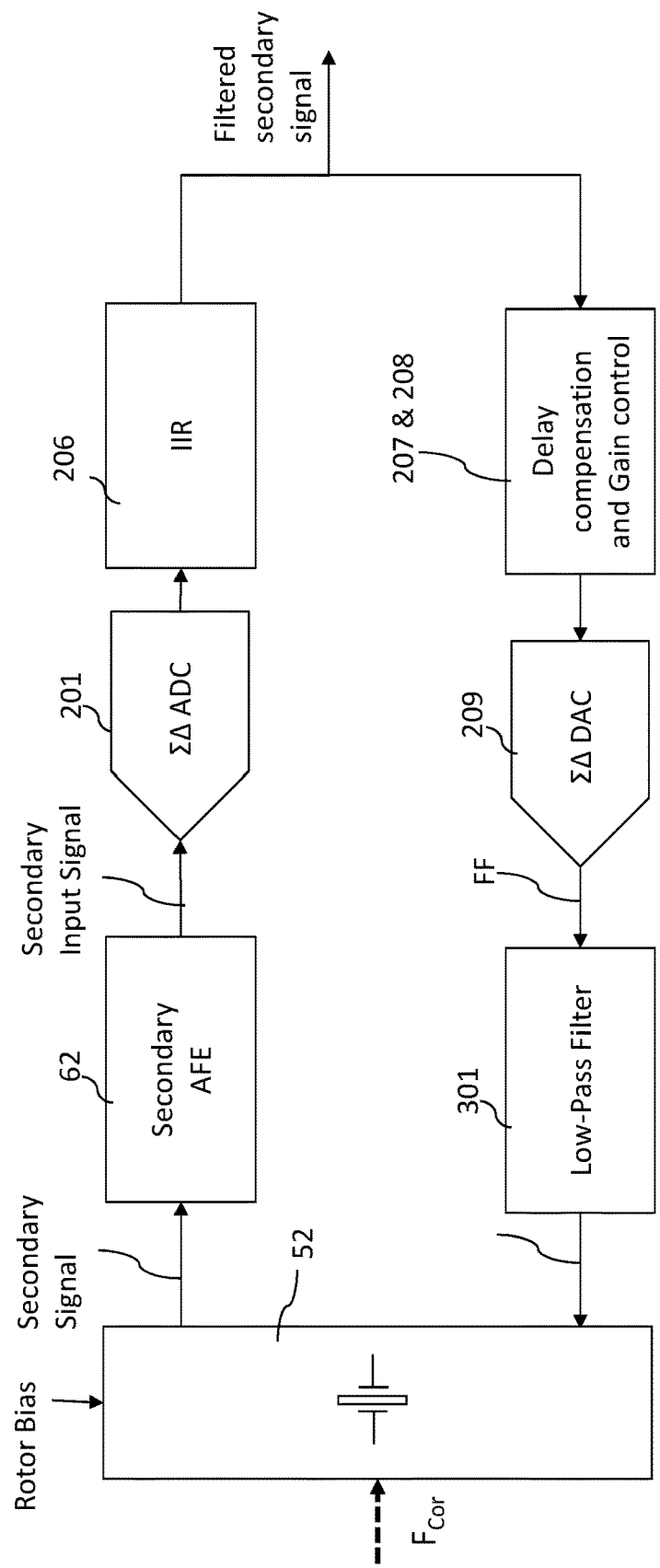
FIG. 13 illustrates a schematic of an alternative embodiment of a part of a secondary loop circuitry.

According to FIG. 13, the secondary signal is received from the secondary element (52) and analog signal processing is performed in the secondary analog front end circuitry (62) for producing the secondary input signal ready for digitization. A single-bit second-order sigma-delta analog-to-digital converter $\Sigma\Delta$ ADC (201) with sampling rate of 10 MS/s (10*10^6 samples per second) provides an over-sampling ratio of 250 when the signal frequency (resonance frequency $f_{RES}$) is 20 kHz. A feasible over-sampling ratio range may be between 100 and 300. In this exemplary case the quantization noise limited dynamic range of the sigma-delta analog-to-digital converter $\Sigma\Delta$ ADC (201) is close to 16 bits, while the delay is typically only two samples. A high oversampling ratio, in other words a high sampling rate reduces delays caused by the ADC conversion. Further improvement in terms of quantization is gained in straight-forward manner by using for example a third order modulator in the sigma-delta ADC circuitry. This enables creation of a local quantization noise minimum at the signal frequency by configuring the sigma-delta ADC to have a notch in its quantization noise transfer function at the signal frequency or more accurately at the resonance frequency $f_{RES}$. This method even allows a lower sampling rate in case the delay is allowed to be increased from that of an embodiment using a second order modulator.

The single-bit data stream may be directly fed to the first infinite impulse response filter IIR (206) without any change in data rate at the input or the output of the first IIR (206). Thus, decimation of the signal is not needed, and same sampling frequency may be used in the entire force feedback loop. The peaking type second infinite impulse response filter IIR (206) will significantly reduce the high-frequency quantization noise content in the filtered secondary signal but does not eliminate it. Therefore it is of major importance to consider the remaining quantization noise in demodulation of the digitized (and preferably IIR filtered) secondary signal in the coherent detector circuitry (CD, not shown) either using additional filtering before demodulation or by using a sine demodulation carrier (I) with high linearity and with same data rate as the digitized secondary input signal data rate to prevent the folding of out-of-band noise components. The digitized and preferably IIR filtered (and thus phase delayed) secondary signal may be used for generation of the force feedback signal (FF). Further secondary delay and gain control circuitries (207 & 208) may be provided for adjusting delay and gain of the force feedback signal before it is converted to an analog force feedback signal (FF) in a third digital-to analog converter (209). A further analog low-pass filter (301) may be configured in the secondary analog back-end for filtering the force feedback signal (FF) in order to reduce e.g. high frequency noise content in the force feedback signal (FF).

Preferably, the third DAC (209) in the secondary force feedback loop is a multi-level sigma-delta ($\Sigma\Delta$) digital-to-analog converter ($\Sigma\Delta$ DAC), operating at same frequency as the second ADC (201) in the digital secondary loop (200). Use of such multi-level DAC reduces quantization noise. With this approach, there is no need for additional filtering between the ADC (201) and the third DAC (209), while same sampling rate ensures that no folding takes place in the digital part. Cross-coupling in the analog part may potentially become an issue and therefore it may be important to add the analog low-pass filter (301) to attenuate power above the Nyquist frequency of sampling rate. Compromise can be made between the number of quantization levels at the third DAC (209) output, output linearity, and the complexity of the low-pass filter (301) in the analog back-end part of the circuitry. Delay in the low-pass filter (301) must remain small and it is preferable to configure the corner frequency of the low-pass filter (301) to at least ten times (10×) the signal frequency of the secondary signal. Analog low-pass filtering may be used to reduce the risk of quantization noise of the third DAC (209) converting into signal frequency error also due to non-idealities of the sensor element and/or due to folding at the ADC (209). However, the secondary mass may also be utilized as a filter for the high-frequency quantization noise, since inertia of the mass causes it to act as a mechanical low pass filter. Care must be taken that high-frequency modes of the secondary mass together with non-linearity of the MEMS element and sampling operation at the ADC (209) do not cause noise to fold to signal frequency if there is very high noise content at high frequencies.

A benefit from the alternative embodiment illustrated in FIG. 13 is that delay in the converter circuitries are minimized and power consumption by the converter circuitries is also reduced in comparison to a Nyquist type converters.

Coherent Detector

Figure 14:
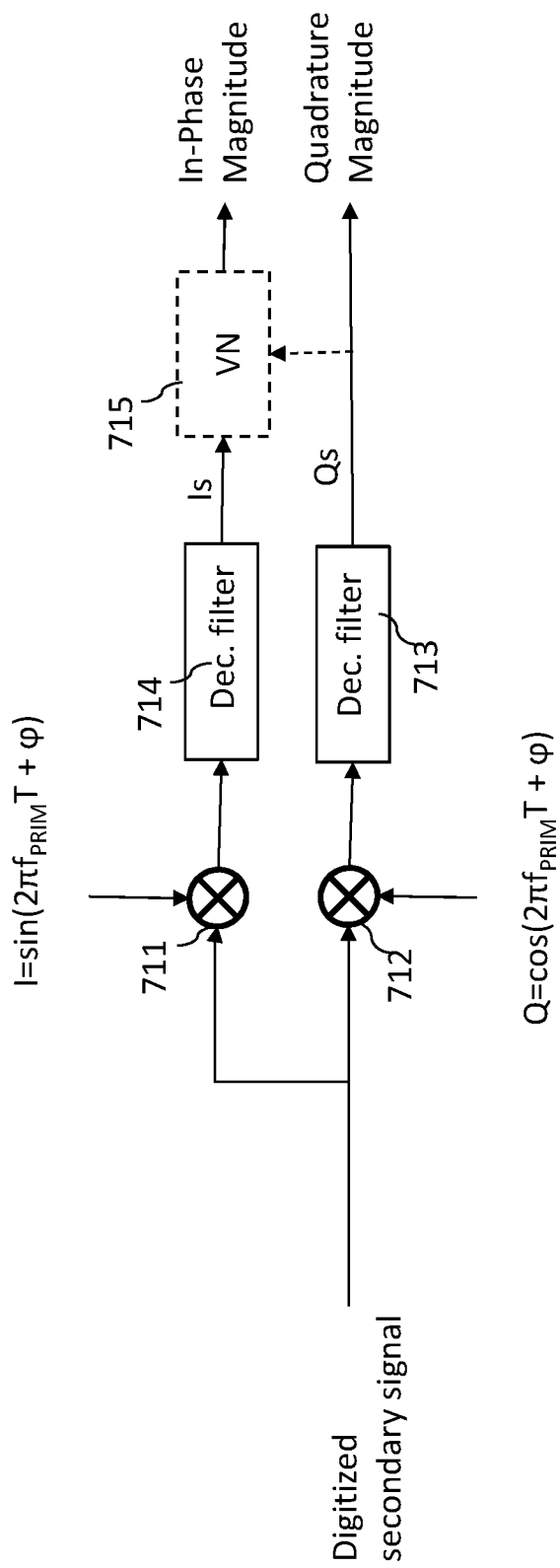
FIG. 14 is a schematic of an exemplary coherent detector circuitry.

FIG. 14 presents an exemplary schematic of an exemplary coherent detection circuitry CD (202), which may be used in the digital secondary loop in connection with any of the controller circuitries disclosed in FIGS. 2 to 6.

The in-phase demodulation signal $I=\sin(2\pi f_{RES}T+\varphi_3)$ and the quadrature phase demodulation signal $Q=\sin(2\pi f_{RES}T+\varphi_4)$, which in ideal case can be expressed as $Q=\cos(2\pi f_{RES}T+\varphi_3)$ are phase adjusted in order to adjust the phase of these signals to match with the in-phase and quadrature components of the digitized secondary signal and to set the relative phase difference of the I and Q signals to 90 degrees. As disclosed above, phases adjusted demodulation signals I and Q may be received from suitably calibrated phase shifting filters APF1 (151) and APF2 (152), which receive an oscillation signal from the primary loop at the resonance frequency $f_{RES}$. Alternatively, the modulation signals may be received from a DDS as in FIG. 2. A purpose for performing phase adjustments for the demodulation signals with the phase shifting filters is to ensure that the signals used to down convert the digitized secondary signal are in same phase with the digitized secondary signal so that the down conversion is as phase aligned as possible and no quadrature signal component leaks to the obtained in-phase magnitude component signal and vice versa. The phase value $\varphi_3$ and/or $\varphi_4$ is adjusted to compensate any and all system delays which cause phase difference between the phase adjusted digitized primary signal in phase $\varphi_1$ and the digitized secondary signal after phase shifting it in the digital secondary loop or without phase shifting, depending on the digital secondary loop design.

The digitized secondary signal received from the second analog-to-digital converter ADC (201) and optionally filtered and phases shifted with the first IIR filter (206) or the first low pass filter (216), may be divided into two secondary signal processing branches within the coherent detector circuitry CD (202), namely an in-phase branch (711, 714, 715) and a quadrature branch (712, 713). The delayed in-phase demodulation signal I is used for down converting signal in the in-phase branch of the coherent detector circuitry and the delayed quadrature phase demodulation signal Q is used for down converting signal in the quadrature branch of the coherent detector circuitry (202). If quadrature compensation is not used, the quadrature branch may be omitted.

In the in-phase signal processing branch the digitized secondary signal is down converted with a first mixer circuitry (711), now using the delayed in-phase demodulation signal $I=\sin(2\pi f_{REF}T+\varphi_3)$, the down conversion resulting to an in-phase magnitude signal. It is important to perform the phase aligned down conversion with minimized phase error in demodulation, in other words in as perfect phase alignment as possible. Perfect in this connection indicates that phases of the signals are the same or that they have a high statistical dependency. In down conversion, the wanted signal band of the secondary signal is converted into very low frequencies, in such a way that input angular rate produces sensor output response at matching frequency. In an embodiment, the down converted wanted signal band starts from direct current level, i.e. 0 Hz. The down converted in-phase magnitude signal may then be low-pass filtered in order to reduce any unwanted signal components with higher frequencies. A decimating filter (714), for example a cascaded integrator-comb (CIC) filter, may be used for filtering the down converted in-phase magnitude signal and to reduce the sampling rate of the in-phase magnitude signal. A decimating filter (714) is flexible in view of large changes in the sampling frequency, and it also efficiently filters out any harmonic components of the primary frequency which may appear in the signal during down conversion.

If the secondary loop contains high level of quantization noise at high frequencies as a result of use of a sigma-delta ADC for digitizing the secondary signal, it may be useful to utilize the same high sampling rate in level of 100-300 times the resonance frequency in both digital primary and digital secondary loops and in the signal paths between the digital secondary and digital primary loops. At minimum, linear interpolation of primary loop signal in order to have same sampling rate as secondary may be feasible. Use of same sampling rate will prevent down conversion of secondary ADC quantization noise in the demodulation process, assuming that the primary signal is free from quantization noise and essentially also from signal power above $f_{RES}$. In theory, a sampling rate of order of just 10 times the resonance frequency could be used, if force feedback was not used in the secondary loop. However, force feedback response time requirements set the practical minimum of sampling rate of the digital circuitry to about 100 times the resonance frequency.

After optionally filtering the in-phase magnitude signal with the decimating filter (714), small remaining phase errors in the in-phase magnitude signal may further be corrected calculating a vector norm for the achieved in-phase and quadrature channel (Is, Qs) magnitude signals. A vector norm circuitry VN (715) may be included in the in-phase signal processing branch that is configured to calculate the vector norm $\sqrt{(Is)^2+(Qs)^2}$ for the in-phase magnitude signal, so that the vector norm indicates absolute value of length of in-phase magnitude value (Is) and quadrature magnitude value vectors (Qs) combined. Sign of the vector norm is the same as sign of the in-phase signal vector, in order to maintain the correct direction of the detected angular velocity. Thus, the resulting in-phase magnitude signal provided by the coherent detector circuitry may comprise absolute value of length of the resulting in-phase and quadrature magnitude vectors combined. Calculation of vector norm may be used for compensating error caused by for example non-optimal phase difference (deviating from exact 90 degrees) between the in-phase and quadrature demodulation signals I and Q corresponding to resonance frequency signals with relative phases φ3 and φ4. A benefit for using calculation of vector norm after performing phase aligned detection for the in-phase signal rather than ensuring the exact 90-degree phase difference between the digital oscillation signals φ3 and φ4 is that the design constraints of the circuitry producing these signals may be reduced. Vector norm calculation can be useful to eliminate effect of any phase mismatches in demodulation. For example, in the presence of a demodulation clock phase misalignment, quadrature compensation might react to angular rate signals. Thus, at frequencies beyond quadrature compensation bandwidth, the gain of in-phase magnitude channel can change. Vector norm calculation can eliminate this type of frequency dependent gain shift. Efficient calculation of vector nom may be implemented using CORDIC algorithm.

In one alternative implementation, the delayed and scaled primary offset compensation signal provided by the with primary offset compensation circuitry POC (203) is subtracted from the in-phase branch of the coherent detector DC (202) by coupling the subtraction element (213) in the in-phase branch before down conversion with the first mixer circuitry (711).

In the quadrature signal processing branch the digitized secondary signal is down converted in a second mixer circuitry (712) using the delayed quadrature phase demodulation signal Q, resulting a quadrature magnitude signal. Similarly to the in-phase demodulation signal I, it is important to perform the down conversion of the digitized secondary signal in as perfect phase alignment as possible. Phase error in down conversion may cause gain error and also offset dependency, especially if quadrature compensation is not perfect. In down conversion, the wanted signal band of the secondary signal is converted into very low frequencies, in such a way that input angular rate produces sensor output response at matching frequency. In an embodiment, the down converted wanted signal band starts from direct current level, i.e. 0 Hz. The down converted quadrature branch signal is then low-pass filtered in order to reduce any unwanted signal components with higher frequency. A decimating filter (713) may be used for filtering the down converted quadrature magnitude signal when needed. Result of the down conversion and filtering in the quadrature signal processing branch is a digital signal representing magnitude of the quadrature component in the secondary input signal. In an embodiment, the decimating filter attenuates any signal components with frequency above about 100 Hz. It should be noticed that decimating filters (713, 714) are optional, and may be omitted from the coherent detector circuitry (202) for example when the digital LPF (106) and the IIR (206) are configured to filter any quantization noise caused by the first or second ADCs (101, 201) respectively.

Offset Compensation

Figure 15:
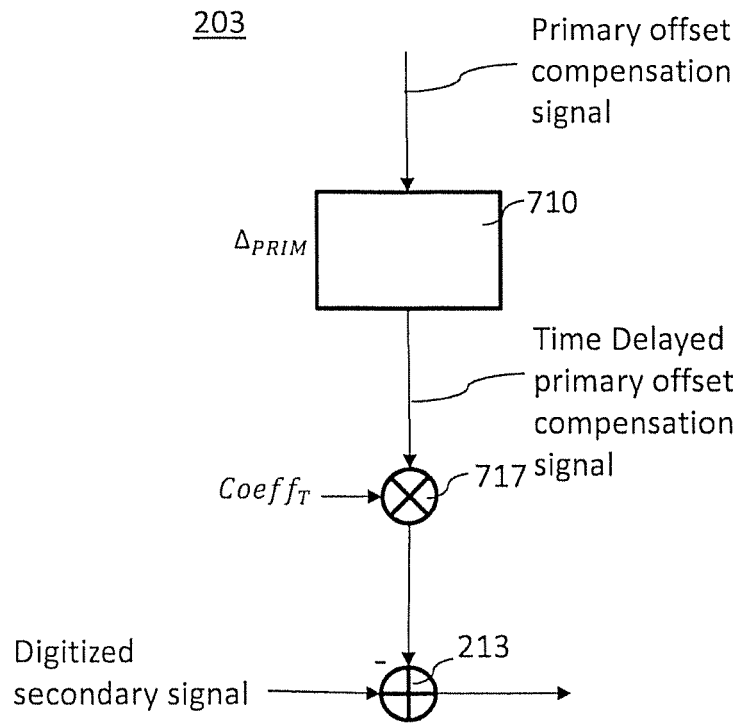
FIG. 15 is a schematic of an exemplary primary offset compensation circuitry.

FIG. 15 illustrates an embodiment of the primary offset compensation circuitry POC (203). The primary drive induced secondary offset may occur for various reasons. For example, crosstalk between the primary drive and secondary signal may be detected as existence of an in-phase component in the secondary signal when primary motion is still small, but when primary drive is activated. Other exemplary sources of offset between the primary and secondary channels are demodulation errors, direct excitation of secondary mass due to primary motion of the primary mass, ripple due to non-zero impedance of bias voltages and un-isometric damping, to mention a few. Offset refers thus to any deviation from zero value in the secondary signal, when the gyroscope device is not subject to angular rate. The offset compensation circuitry comprising the digital delay circuitry (710), a multiplier circuitry (717) and is coupled to the secondary signal chain with a subtraction (summing) element (213) is configured to compensate multitude of such offset signals from the digitized secondary in-phase signal.

A primary delay $\Delta_{PRIM}$ is defined in a calibration process, and one or more calibration coefficients $\text{Coeff}_T$ may be defined for minimizing the in-phase component of the crosstalk signal from the secondary signal. For example, different calibration coefficients $\text{Coeff}_T$ may be defined for different ambient temperatures. Using temperature dependent calibration coefficients $\text{Coeff}_T$ may improve offset compensation in different ambient temperatures beyond what's possible with more traditional temperature compensation. Especially, such temperature dependent calibration coefficients $\text{Coeff}_T$ may enable reducing inaccuracies in the primary loop signals, which correlate with primary drive induced secondary offset. The delay value and/or the corresponding calibration coefficients defined in the calibration process are then stored in a suitable memory or register(s) for subsequent use.

Adjustable delay $\Delta_{PRIM}$ for the primary offset compensation signal needed for enabling primary drive induced secondary offset compensation may be implemented with a suitable digital delay circuitry (710), for example with a programmable FIFO circuitry or with a digital filter configured for introducing the adjustable delay $\Delta_{PRIM}$. Both a FIFO and a digital filter may provide an accurate, small phase step and thus a good phase calibration tolerance. Further, the calibration coefficient $\text{Coeff}_T$ may be applied to the time delayed primary offset compensation signal with the multiplier circuitry (717) before subtracting the resulting offset compensation signal from the digitized secondary signal.

Figure 16:
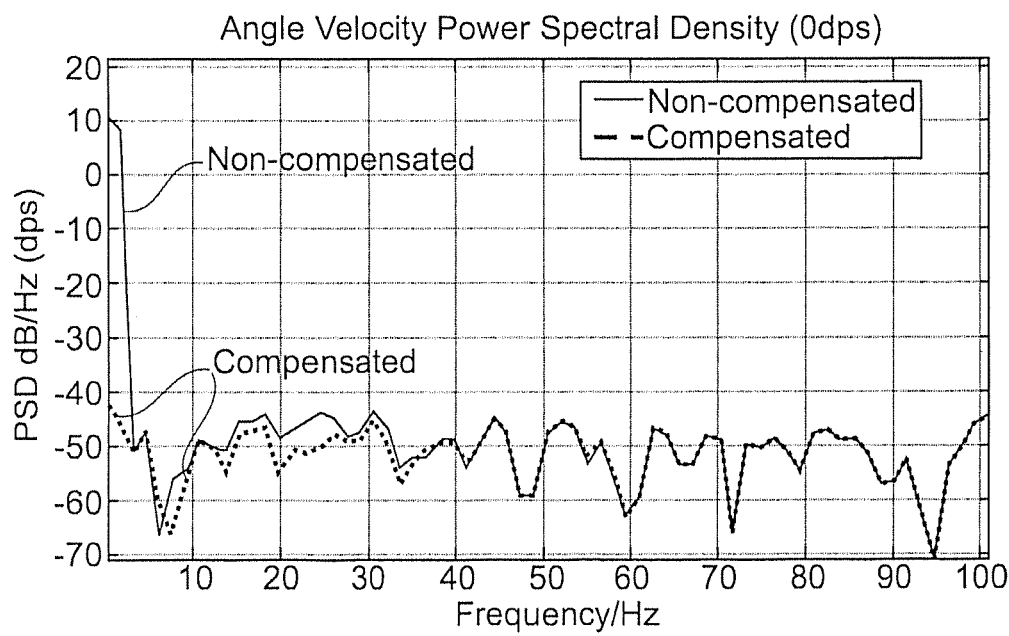
FIG. 16 illustrates a result of compensation of primary offset.

FIG. 16 illustrates a result of compensation of primary drive induced secondary offset in an exemplary MEMS gyroscope. Power spectral density (PSD) of two signals is plotted: a non-compensated and a compensated secondary in-phase signal, in a situation that angular velocity detected is 0 dps (degrees per second). The non-compensated signal shows high offset level especially at frequencies below 5 Hz. Compensated signal demonstrates a significant reduction of primary drive loop induced secondary offset on these frequencies.

It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A digital control circuitry for a MEMS gyroscope, comprising:
   a digital primary loop circuitry configured to process a digitized primary signal, the digital primary loop circuitry comprising
   a first analog-to-digital converter configured to digitize an analog primary input signal into the digitized primary signal, and
   a first infinite impulse filter configured to cause a −90-degree phase shift of the digitized primary signal on a resonance frequency of a mechanical resonator of the MEMS gyroscope, the first digital infinite impulse response filter providing in its output a filtered digitized primary signal; and
a digital secondary loop circuitry configured to process a digitized secondary signal; and
a digital phase shifting filter circuitry configured to generate two phase shifted demodulation signals from the filtered digitized primary signal;
wherein the digital secondary loop is configured to demodulate the digitized secondary signal using the two phase shifted demodulation signals.

2. The digital controller circuitry according to claim 1, wherein
the first infinite impulse response filter is further configured to filter quantization noise in the digitized primary signal caused by the first analog-to-digital converter.

3. The digital controller circuitry according to claim 2, wherein the digital secondary loop further comprises a second digital low pass IIR filter configured to cause a −90-degree phase shift of the digitized secondary signal on the resonance frequency of the mechanical resonator of the MEMS gyroscope.

4. The digital controller circuitry according to claim 3, wherein
the second digital low pass filter is further configured to filter quantization noise in the digitized secondary signal caused by the second analog-to digital converter.

5. The digital controller circuitry according to claim 2, wherein the digital phase shifting filter circuitry comprises at least two digital filters configured for phase shifting the digitized primary signal for generating the in-phase demodulation signal and the quadrature demodulation signals, and wherein the phase shifting digital filters are configured to be calibrated with calibrated filter coefficients, which coefficients may vary based on temperature.

6. The digital controller circuitry according to claim 5, wherein a quantization noise transfer function of the analog-to-digital converter is configured have a notch at the resonance frequency of the mechanical resonator of the MEMS gyroscope.

7. The digital controller circuitry according to claim 1, wherein:
the digital secondary loop circuitry comprises a second analog-to-digital converter configured to digitize an analog secondary input signal into the digitized secondary signal; and
the digital phase shifting filter circuitry produces at its outputs the two phase shifted demodulation signals comprising an in-phase demodulation signal and a quadrature demodulation signal; and
the digital secondary loop circuitry further comprises a coherent detector circuitry configured for receiving the in-phase demodulation signal and the quadrature demodulation signal and for performing a phase aligned demodulation of the digitized secondary signal using the in-phase and quadrature demodulation signals.

8. The digital controller circuitry according to claim 7, wherein the coherent detector circuitry comprises:
an in-phase branch comprising a first mixer circuitry configured to use the in-phase demodulation signal for down converting the digitized secondary signal into an in-phase magnitude signal; and
a quadrature branch comprising a second mixer circuitry configured to use the quadrature demodulation signal for down converting the digitized secondary signal in to a quadrature magnitude signal,
wherein the in-phase branch of the coherent detector circuitry further comprises a vector norm circuitry configured to calculate a vector norm for the in-phase magnitude signal, the vector norm comprising absolute value of length of in-phase magnitude value and quadrature magnitude value vectors combined.

9. The digital controller circuitry according to claim 8, wherein at least one of the in-phase branch and the quadrature branch further comprise a decimating filter configured to filter and to reduce the sampling rate of the respective magnitude signal.

10. The digital controller circuitry according to claim 1, wherein any of the first and second analog-to-digital converters comprise a sigma-delta analog-to-digital converter.

11. The digital controller circuitry according to claim 10, wherein the sigma-delta converter comprises a continuous-time sigma-delta analog-to-digital converter.

12. The digital controller circuitry according to claim 1, wherein the digital primary loop further comprises an automatic gain control circuitry configured to detect a total alternating amplitude level of the digitized primary signal and to control a digital multiplication element configured to multiply the amplitude of the digitized phase shifted primary signal for producing a digital primary AC signal.

13. The digital controller circuitry according to claim 1, wherein the digital primary loop further comprises an automatic gain control circuitry configured to detect a total alternating amplitude level of the digitized primary signal and to provide a DC signal to be summed with the phase shifted digitized primary signal for producing the digital primary AC signal.

14. The digital controller circuitry according to claim 1, wherein the digital primary loop further comprises a start-up circuitry configured to provide a start-up signal in the digital primary loop, the start-up signal comprising a digital pulse form causing the first digital infinite impulse response filter to output a signal comprising a frequency component at the resonance frequency of the mechanical resonator of the MEMS gyroscope.

15. The digital controller circuitry according to claim 14, wherein the digital primary loop further comprises an amplitude limiting circuitry configured to control amplitude of the filtered digitized primary signal at the output of the first digital infinite impulse response filter.

16. The digital controller circuitry according to claim 1, wherein the digital controller circuitry is further configured to provide the filtered digitized primary signal as an input to a phase locked loop circuitry, wherein the phase locked loop circuitry is configured to provide a master clock for the digital controller, and wherein the master clock is synchronized to the resonance frequency of the mechanical resonator of the MEMS gyroscope.

17. A MEMS gyroscope comprising:
a primary element,
a secondary element,
analog front end circuitry configured to process analog electrical signals received from the primary and secondary elements, and
the digital controller circuitry according to claim 1,
wherein the primary element and the secondary element are configured to be provided with a DC rotor bias voltage for capacitive detection of motion of the elements.

* * * * *